United States Patent
Agarwal

(10) Patent No.: US 8,656,141 B1
(45) Date of Patent: Feb. 18, 2014

(54) ARCHITECTURE AND PROGRAMMING IN A PARALLEL PROCESSING ENVIRONMENT WITH SWITCH-INTERCONNECTED PROCESSORS

(75) Inventor: Anant Agarwal, Weston, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 1743 days.

(21) Appl. No.: 11/302,956

(22) Filed: Dec. 13, 2005

(51) Int. Cl.
*G06F 15/00* (2006.01)

(52) U.S. Cl.
USPC .......... 712/10; 712/11; 712/14; 712/16; 712/24; 717/149; 710/22

(58) Field of Classification Search
None
See application file for complete search history.

(56) References Cited

U.S. PATENT DOCUMENTS

| | | | |
|---|---|---|---|
| 4,491,911 A * | 1/1985 | Sato | 711/206 |
| 4,716,523 A * | 12/1987 | Burrus et al. | 710/28 |
| 4,878,166 A * | 10/1989 | Johnson et al. | 710/307 |
| 5,057,837 A | 10/1991 | Colwell et al. | |
| 5,119,485 A | 6/1992 | Ledbetter et al. | |
| 5,148,536 A | 9/1992 | Witek et al. | |
| 5,179,680 A | 1/1993 | Colwell et al. | |
| 5,241,639 A | 8/1993 | Feldbrugge | |
| 5,313,551 A * | 5/1994 | Labrousse et al. | 711/149 |
| 5,418,973 A * | 5/1995 | Ellis et al. | 712/3 |
| 5,430,888 A | 7/1995 | Witek et al. | |
| 5,596,754 A | 1/1997 | Lomet | |
| 5,822,605 A * | 10/1998 | Higuchi et al. | 712/11 |
| 5,893,153 A | 4/1999 | Tzeng et al. | |
| 5,960,461 A | 9/1999 | Frank et al. | |
| 6,226,710 B1 * | 5/2001 | Melchior | 711/108 |
| 6,317,820 B1 * | 11/2001 | Shiell et al. | 712/32 |
| 6,332,178 B1 | 12/2001 | Dean et al. | |
| 6,651,145 B1 | 11/2003 | Jamil et al. | |
| 6,973,484 B1 * | 12/2005 | Singhal et al. | 709/216 |
| 7,200,713 B2 | 4/2007 | Cabot et al. | |
| 7,394,288 B1 | 7/2008 | Agarwal | |
| 7,461,236 B1 | 12/2008 | Wentzlaff | |
| 7,539,845 B1 | 5/2009 | Wentzlaff et al. | |
| 2002/0129208 A1 | 9/2002 | Barroso et al. | |
| 2004/0008677 A1 | 1/2004 | Cen | |
| 2004/0250046 A1 | 12/2004 | Gonzalez et al. | |
| 2004/0268286 A1 | 12/2004 | New et al. | |
| 2005/0071573 A1 | 3/2005 | Dodson et al. | |

(Continued)

FOREIGN PATENT DOCUMENTS

| | | |
|---|---|---|
| EP | 517429 A2 * | 12/1992 |
| WO | WO 2004/072796 | 8/2004 |
| WO | WO 2004/072796 A2 | 8/2004 |

OTHER PUBLICATIONS

Taylor, Michael, The Raw Prototype Design Document, Nov. 1999. Selected pages. Cached and retrievable by CiteSeer, also attached.*

(Continued)

*Primary Examiner* — Keith Vicary
(74) *Attorney, Agent, or Firm* — Fish & Richardson P.C.

(57) ABSTRACT

An integrated circuit includes a plurality of tiles. Each tile includes a pipelined processor configured to process multiple streams of instructions for the processor; and a switch including switching circuitry to forward data over data paths from other tiles to one or more pipeline stages of the processor and to switches of other tiles. At least some of the data is forwarded based on one or more streams of instructions for the switch.

35 Claims, 19 Drawing Sheets

(56) References Cited

U.S. PATENT DOCUMENTS

| | | |
|---|---|---|
| 2005/0144390 A1 | 6/2005 | Mattina et al. |
| 2006/0179429 A1 | 8/2006 | Eggers et al. |
| 2007/0055825 A1 | 3/2007 | Blumrich et al. |

OTHER PUBLICATIONS

F. de Souza and P. Rounce, "DTSVLIW: VLIW Performance with Sequential Code", Proc. of the 12th Brazilian Symp. on Computer Architecture and High Performance Computing, pp. 271-278, 2000.*

Taylor, Michael Bedford et. al., "Evaluation of the Raw Microprocessor: An Exposed-Wire-Delay Architecture for ILP and Streams," *Proceedings of International Symposium on Computer Architecture*, Jun. 2004.

Taylor, Michael Bedford et. al., "Scalar Operand Networks: On-Chip Interconnect for ILP in Partitioned Architectures," *Proceedings of the International Symposium on High Performance Computer Architecture*, Feb. 2003.

Taylor, Michael Bedford et. al., "A 16-Issue Multiple-Program-Counter Microprocessor with Point-to-Point Scalar Operand Network," *Proceedings of the IEEE International Solid-State Circuits Conference*, Feb. 2003.

Taylor, Michael Bedford et. al., "The Raw Microprocessor: A Computational Fabric for Software Circuits and General-Purpose Programs," *IEEE Micro*, pp. 25-35, Mar.-Apr. 2002.

Lee, Walter et. al., "Space-Time Scheduling of Instruction-Level Parallelism on a Raw Machine," *Proceedings of the Eighth International Conference on Architectural Support for Programming Languages and Operating Systems* (ASPLOS-VIII), San Jose, CA, Oct. 4-7, 1998.

Kim, Jason Sungtae et. al., "Energy Characterization of a Tiled Architecture Processor with On-Chip Networks," *International Symposium on Low Power Electronics and Design*, Seoul, Korea, Aug. 25-27, 2003.

Lee, Walter et. al., "Convergent Scheduling," *Proceedings of the 35$^{th}$ International Symposium on Microarchitecture*, Istanbul, Turkey, Nov. 2002.

Wentzlaff, David and Anant Agarwal, "A Quantitative Comparison of Reconfigurable, Tiled, and Conventional Architectures on Bit-Level Computation," *MIT/LCS Technical Report LCS-TR-944*, Apr. 2004.

Suh, Jinwoo et. al., "A Performance Analysis of PIM, Stream Processing , and Tiled Processing on Memory-Intensive Signal Processing Kernels," *Proceedings of the International Symposium on Computer Architecture*, Jun. 2003.

Barua, Rajeev et. al., "Maps: A Compiler-Managed Memory System for Raw Machines," *Proceedings of the Twenty-Sixth International Symposium on Computer Architecture* (ISCA-26), Atlanta, GA, Jun. 1999.

Barua, Rajeev et al., "Memory Bank Disambiguation using Modulo Unrolling for Raw Machines," *Proceedings of the Fifth International Conference on High Performance Computing*, Chennai, India, Dec. 17-20, 1998.

Taylor, Michael. The Raw Prototype Design Document V5.01 [online]. Department of Electrical Engineering and Computer Science, Massachusetts Institute of Technology, Sep. 6, 2004 [retrieved on Sep. 25, 2006]. Retrieved from the Internet: <ftp://ftp.cag.lcs.mit.edu/pub/raw/documents/RawSpec99.pdf>.

Moritz, Csaba Andras et. al., "Hot Pages: Software Caching for Raw Microprocessors," *MIT/LCS Technical Memo LCS-TM-599*, Aug. 1999.

Agarwal, Anant. "Raw Computation," *Scientific American* vol. 281, No. 2: 44-47, Aug. 1999.

Taylor, Michael Bedford et. al., "Evaluation of the Raw Microprocessor: An Exposed-Wire-Delay AC Architecture for ILP and Streams," *Proceedings of International Symposium on Computer Architecture*, Jun. 2004.

Taylor, Michael Bedford et. al., "Scalar Operand Networks: On-Chip Interconnect for ILP in AD Partitioned Architectures," *Proceedings of the International Symposium on High Peiformance Computer Architecture*, Feb. 2003.

Taylor, Michael Bedford et. al., "A 16-Issue Multiple-Program-Counter Microprocessor with Point-AE to-Point Scalar Operand Network," *Proceedings of the IEEE International Solid-State Circuits Conference*, Feb. 2003.

Taylor, Michael Bedford et. al., The Raw Microprocessor: A Computational Fabric for Software Circuits and General-Purpose Programs, *IEEE Micro*, pp. 25-35, Mar.-Apr. 2002.

Lee, Walter et. al., "Space-Time Scheduling of Instruction-Level Parallelism on a Raw Machine," AG *Proceedings of the Eighth International Conference on Architectural Support for Programming Languages and Operating Systems (A SPL OS- VIII)*, San Jose, CA, Oct. 4-7, 1998.

Kim, Jason Sungtae et. al., "Energy Characterization of a Tiled Architecture Processor with On-Chip AH Networks," *International Symposium on Low Power Electronics and Design*. Seoul, Korea, Aug. 25-27, 2003.

Barua, Rajeev et. al., "Compiler Support for Scalable and Efficient Memory Systems," *IEEE Transactions on Computers*, Nov. 2001.

Waingold, Elliot et. al., "Baring it all to Software: Raw Machines," *IEEE Computer*, pp. 86-93, Sep. 1997.

Lee, Walter et. al., "Convergent Scheduling," *Proceedings of the 35" International Symposium on Microarchitecture*, Istanbul, Turkey, Nov. 2002.

Wentzlaff, David and Anant Agarwal, "A Quantitative Comparison of Reconfigurable, Tiled, and AL Conventional Architectures on Bit-Level Computation," *MITILCS Technical Report LCS-TR-944*, Apr. 2004.

Sub, Jinwoo et. aI., "A Performance Analysis of PIM, Stream Processing, and Tiled Processing on AM Memory-Intensive Signal Processing Kernels," *Proceedings of the International Symposium on Computer Architecture*, Jun. 2003.

Barna, Rajeev et. al., "Maps: A Compiler-Managed Memory System for Raw Machines," AN *Proceedings of the Twenty-Sixth International Symposium on Computer Architecture (ISCA-26)*, Atlanta, GA, Jun. 1999.

Barna, Rajeev et. al., "Memory Bank Disambiguation using Modulo Unrolling for Raw Machines," AO *Proceedings of the Fifth International Conference on High Peiformance Computing*, Chennai, India. Dec. 17-20, 1998.

Agarwal, A. et. al., "The Raw Compiler Project," *Proceedings of the Second SUIF Compiler Workshop*, Stanford, CA, Aug. 21-23, 1997.

Taylor, Michael Bedford et. al., "Scalar Operand Networks," *IEEE Transactions on Parallel and Distributed Systems @,ecial Issue on On-Chip Networks)*, Fe 2005.

Taylor, Michael. The Raw Prototype Design Document V5.01 [online]. Department of Electrical AR Engineering and Computer Science, Massachusetts Institute of Technology, Sep. 6, 2004 [retrieved on Sep. 25, 2006]. Retrieved from the Internet: <ftp:IIftp.cal!.lcs.mit.eduipub/raw/documents1RawSpec99.pdf.>.

Moritz, Csaba Andras et. ai., "Hot Pages: Software Caching for Raw Microprocessors," *MIT/LeS Technical Memo LCS-TM-599*, Aug. 1999.

\* cited by examiner

ARCHITECTURE AND PROGRAMMING IN A PARALLEL PROCESSING ENVIRONMENT WITH SWITCH-INTERCONNECTED PROCESSORS

CROSS-REFERENCE TO RELATED APPLICATIONS

This application is also related to U.S. application Ser. No. 11/302,984 titled "TRANSFERRING DATA IN A PARALLEL PROCESSING ENVIRONMENT," U.S. application Ser. No. 11/300,649, titled "MANAGING POWER IN A PARALLEL PROCESSING ENVIRONMENT," U.S. application Ser. No. 11/302,961, titled "PROCESSING DATA IN A PARALLEL PROCESSING ENVIRONMENT," U.S. application Ser. No. 11/302,962, titled "MANAGING YIELD FOR A PARALLEL PROCESSING INTEGRATED CIRCUIT," U.S. application Ser. No. 11/302,983, titled "CONFIGURING CIRCUITRY IN A PARALLEL PROCESSING ENVIRONMENT," each of which is being filed concurrently with the present application, and each of which is also incorporated herein by reference.

BACKGROUND

The invention relates to integrated circuits, and more particularly to architecture and programming in a parallel processing environment.

FPGAs (Field Programmable Gate Arrays) and ASICs (Application Specific Integrated Circuits) are two exemplary approaches for implementing customized logic circuits. An ASIC is designed for a specific application. The cost of building an ASIC includes the cost of verification, the cost of physical design and timing closure, and the NRE (non-recurring costs) of creating mask sets and fabricating the ICs. Due to the increasing costs of building an ASIC, FPGAs became popular in the late 1990's. Unlike an ASIC, an FPGA is reprogrammable, in that it can be reconfigured for each application. Similarly, as protocols change, an FPGA design can be changed even after the design has been shipped to customers, much like software can be updated. However, FPGAs are typically more expensive, often costing 10 to 100 times more than an ASIC. FPGAs are typically power hungry and their performance can be 10 to 20 times worse than that of an ASIC.

The MIT Raw integrated circuit design is an example of a tiled integrated circuit with a computational substrate that provides reconfigurability of an FPGA along with the performance and capability of an ASIC, described, for example, in "Baring It All to Software: RAW Machines" IEEE Computer, September 1997, pp. 86-93.

SUMMARY

In another aspect, in general, the invention features an integrated circuit comprising: a plurality of tiles, each tile comprising a pipelined processor configured to process multiple streams of instructions for the processor; and a switch including switching circuitry to forward data over data paths from other tiles to one or more pipeline stages of the processor and to switches of other tiles. At least some of the data is forwarded based on one or more streams of instructions for the switch.

This aspect of the invention can include one or more of the following features.

The processor comprises a Very Long Instruction Word (VLIW) processor and the multiple streams of instructions comprise subinstructions of a stream of VLIW instructions.

A subinstruction in a VLIW instruction is able to read from or write to a port of the switch.

The processor is configured to stall execution of a VLIW instruction if a subinstruction of the VLIW instruction is temporarily unable to read from or write to a port of the switch.

The processor includes multiple logic units that operate based on a common program counter.

Each of the multiple streams are processed by a corresponding one of the logic units.

The logic units comprise one or more of an arithmetic logic unit, an arithmetic unit, a multiply accumulate unit, a multiply add unit, a vector unit, a load or store unit, a branch unit, a switch read unit, or a switch write unit.

The logic unit comprises a switch write unit that includes a buffer.

The switch is coupled to bypass paths that connect non-adjacent pipeline stages of the processor.

The switch includes at least one instruction memory, at least one program counter, and at least one logic unit.

The pipelined processor comprises a multithreaded processor, and the processor instruction streams comprise threads.

The processor includes multiple program counters that respectively control execution of the multiple processor instruction streams.

The processor includes multiple register files each associated with a corresponding one of the multiple processor instruction streams.

In another aspect, in general, the invention features a method of compiling a program for an integrated circuit, the integrated circuit comprising tiles, each tile comprising a processor and a switch including switching circuitry to forward data over data paths to the processor and to switches of other tiles. The method includes partitioning the program into subprograms to be processed in different tiles; and subpartitioning the subprograms into a plurality of compute instruction streams for execution in a respective plurality of logic units in the processor of a tile based on a common program counter.

This aspect of the invention can include one or more of the following features.

Partitioning the program into subprograms to be processed in different tiles comprises partitioning the program into a processor subprogram and a switch subprogram for each of the different tiles.

Subpartitioning the subprogram for a tile into a plurality of compute instruction streams comprises subpartitioning the processor subprogram for the tile into the plurality of compute instruction streams.

In another aspect, in general, the invention features a method of compiling a program for an integrated circuit, the integrated circuit comprising tiles, each tile comprising a processor and a switch including switching circuitry to forward data over data paths to the processor and to switches of other tiles. The method includes partitioning the program into sets of instructions that can be executed in parallel; determining in which tile each of the sets of instructions is to be executed; and for those sets of instructions selected to be executed in the same tile, determining which instructions from the sets of instructions are to be executed in parallel in the same macroinstruction.

This aspect of the invention can include one or more of the following features.

Determining which instructions from the sets of instructions are to be executed in parallel in the same macroinstruction is based on information characterizing which functional units are available to be used in parallel to execute a macroinstruction.

Determining in which tile each of the sets of instructions is to be executed is based on critical path information from the graph.

In another aspect, in general, the invention features an integrated circuit comprising: a plurality of tiles, each tile comprising a processor; a switch including switching circuitry to forward data over data paths from other tiles to the processor and to switches of other tiles; and a direct memory access (DMA) queue that stores data to be sent to a memory; wherein each tile is configured to send data stored in the DMA queue to the memory without requiring the processor to execute an instruction for each of multiple segments of the data sized greater than a cache line.

This aspect of the invention can include one or more of the following features.

Each tile is configured to store message data in the direct memory access queue based on information in the message data.

The memory is in the tile.

The memory is in a different tile.

The memory is external to the plurality of tiles.

The memory is configured to operate as a cache.

The data to be sent to the memory is stored in a cache in the tile.

The data to be sent to the memory is stored in a cache in a different tile.

The switch is able to store data received from other tiles in the direct memory access queue without requiring the processor to execute an instruction to receive the data.

The data is received from another tile over a static network according to a switch instruction executed at the switch.

The data is received from another tile over a dynamic network according to routing information in the data.

In another aspect, in general, the invention features an integrated circuit comprising: a plurality of tiles, each tile comprising a processor; a content addressable memory coupled to the processor; and a switch including switching circuitry to forward data over data paths from other tiles to the processor and to switches of other tiles.

In another aspect, in general, the invention features an integrated circuit comprising: a plurality of tiles, each tile comprising a processor; a translation look-aside buffer coupled to the processor; and a switch including switching circuitry to forward data over data paths from other tiles to the processor and to switches of other tiles.

These aspect of the invention can include one or more of the following features.

The processor is a pipelined processor and the switch is coupled to a plurality of stages of the pipeline.

The processor is coupled to bypass paths that connect non-adjacent pipeline stages of the processor.

The switching circuitry is coupled to a buffer accessible within a register name space of the processor.

The buffer comprises an input buffer configured to receive data over an input port of the switch.

The buffer comprises an output buffer configured to send data over an output port of the switch.

In another aspect, in general, the invention features an integrated circuit comprising: a plurality of tiles, each tile comprising a pipelined processor including at least one multiply-accumulate unit; and a switch including switching circuitry to forward data over data paths from other tiles to one or more pipeline stages of the processor and to switches of other tiles.

In another aspect, in general, the invention features an integrated circuit comprising: a plurality of tiles, each tile comprising a pipelined processor including at least one vector unit; and a switch including switching circuitry to forward data over data paths from other tiles to one or more pipeline stages of the processor and to switches of other tiles.

These aspect of the invention can include one or more of the following features.

The processor is coupled to bypass paths that connect non-adjacent pipeline stages of the processor.

The switching circuitry is coupled to a buffer accessible within a register name space of the processor.

The buffer comprises an input buffer configured to receive data over an input port of the switch.

The buffer comprises an output buffer configured to send data over an output port of the switch.

Aspects of the invention can have one or more of the following advantages.

The tiled integrated circuit includes elements in the tiles that enable higher processing power (e.g., more instructions executed in a given cycle, or more efficient memory access) while ensuring correct operation in the presence of pipeline integrated switching. The register mapped pipeline integrated switch interface enables a tile to send a value over a network port from any pipeline stage as soon as that value is available, without having to wait until the value reaches the writeback stage.

Other features and advantages of the invention will become apparent from the following description, and from the claims.

DESCRIPTION

1 Tiled Circuit Architecture Overview

Figure 1:
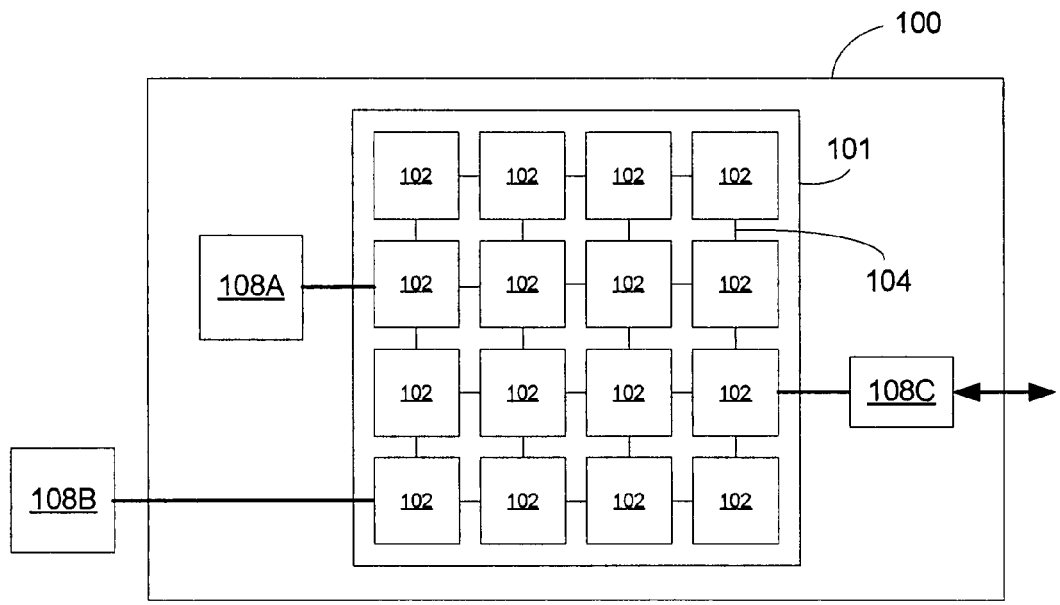
FIG. 1 is a block diagram of a tiled integrated circuit.

Referring to FIG. 1, an integrated circuit 100 (or "chip") includes an array 101 of interconnected tiles 102. Each of the tiles 102 is a functional unit that includes a processor and a switch that forwards data from other tiles to the processor and to switches of other tiles over data paths 104. The switch is coupled to the processor so that data can be sent to or received from processors of other tiles. The integrated circuit 100 includes other on-chip circuitry such as input/output (I/O) interface circuitry to couple data in and out of the circuit 100, and clock distribution circuitry to provide clock signals to the processors of the tiles.

The integrated circuit 100 shown in FIG. 1 includes a two-dimensional array 101 of rectangular tiles with data paths 104 between neighboring tiles to form a mesh network. The data path 104 between any two tiles can include multiple wires to support parallel channels in each direction. Optionally, specific sets of wires between two tiles can be dedicated to different mesh networks that can operate independently. Alternative network configurations include networks having paths that extend to diagonal neighbors or to tiles that are multiple rows or columns away. Other configurations include higher dimensional mesh topologies. For example, multiple layered integrated circuits or other three-dimensional configurations can be used to form networks in which the connections form a cube of network nodes.

The data paths 104 from one or more tiles at the edge of the network can be coupled out of the array of tiles 101 (e.g., over I/O pins) to an on-chip device 108A, an off-chip device 108B, or a communication channel interface 108C, for example. Multiple wires of one or more parallel channels can be multiplexed down to a fewer number of pins or to a serial channel interface. For example, the wires for one or more channels can be multiplexed onto a high-speed serial link (e.g., SerDes, SPIE4-2, or SPIE5) or a memory controller interface (e.g., a memory controller for DDR, QDR SRAM, or Dynamic RAM). The memory controller can be implemented off-chip or in logic blocks within a tile or on the periphery of the integrated circuit 100.

The following exemplary implementations are described in the context of tiles that have the same structure and functionality. Alternatively there can be multiple "tile types" each having different structure and/or functionality. For example, tiles that couple data off of the integrated circuit 100 can include additional circuitry for I/O functions.

Figure 2A:
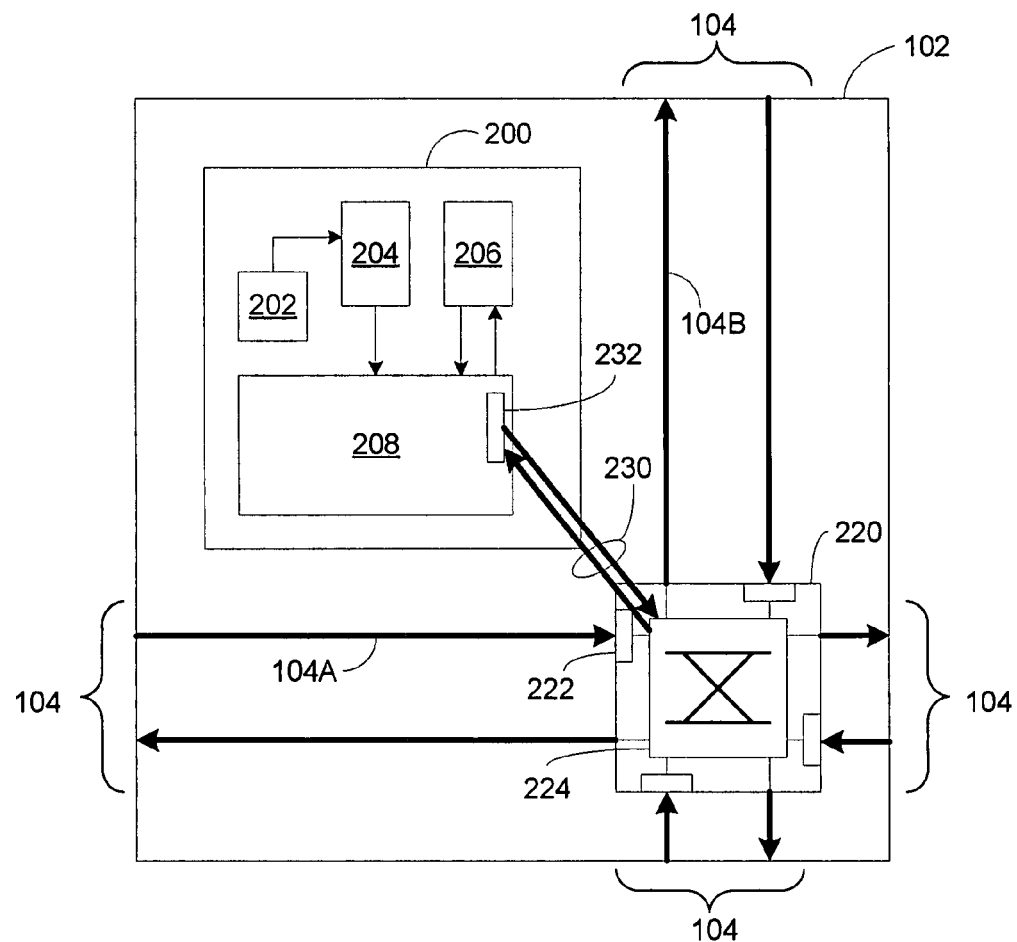
FIG. 2A is a block diagram of a tile.

Referring to FIG. 2A, a tile 102 includes a processor 200, a switch 220, and sets of incoming wires 104A and outgoing wires 104B that form the data paths 104 for communicating with neighboring tiles. The processor 200 includes a program counter 202, an instruction memory 204, a data memory 206, and a pipeline 208. Either or both of the instruction memory 204 and data memory 206 can be configured to operate as a cache for off-chip memory. The processor 200 can use any of a variety of pipelined architectures. The pipeline 208 includes pipeline registers, functional units such as one or more arithmetic logic units (ALUs), and temporary storage such as a register file. The stages in the pipeline 208 include, for example, instruction fetch and decode stages, a register fetch stage, instruction execution stages, and a write-back stage. Whether the pipeline 208 includes a single ALU or multiple ALUs, an ALU can be "split" to perform multiple operations in parallel. For example, if the ALU is a 32-bit ALU it can be split to be used as four 8-bit ALUs or two 16-bit ALUs. The processor 200 can include other types of functional units such as a multiply accumulate unit, or a vector unit. The processor 200 can be multithreaded and/or have capabilities of a Very Long Instruction Word (VLIW) processor, a superscalar processor, or a vector processor.

The switch 220 includes input buffers 222 for temporarily storing data arriving over incoming wires 104A, and switching circuitry 224 (e.g., a crossbar fabric) for forwarding data to outgoing wires 104B or the processor 200. The input buffering provides pipelined data channels in which data traverses a path 104 from one tile to a neighboring tile in predetermined number of clock cycles (e.g., a single clock cycle). This pipelined data transport enables the integrated circuit 100 to be scaled to a large number of tiles without needing to limit the clock rate to account for effects due to wire lengths such as propagation delay or capacitance. (Alternatively, the buffering could be at the output of the switching circuitry 224 instead of, or in addition to, the input.)

1.1 Switch Operation

A tile 102 controls operation of a switch 220 using either the processor 200, or separate switch processor dedicated to controlling the switching circuitry 224. Separating the control of the processor 200 and the switch 220 allows the processor 200 to take arbitrary data dependent branches without disturbing the routing of independent messages passing through the switch 220.

In some implementations, the switch 220 includes a switch processor that receives a stream of switch instructions for determining which input and output ports of the switching circuitry to connect in any given cycle. For example, the switch instruction includes a segment or "subinstruction" for each output port indicating to which input port it should be connected. In other implementations, the processor 200 receives a stream of compound instructions with a first instruction for execution in the pipeline 208 and a second instruction for controlling the switching circuitry 224.

The switch instructions enable efficient communication among the tiles for communication patterns that are known at compile time. This type of routing is called "static routing." An example of data that would typically use static routing are operands of an instruction to be executed on a neighboring processor.

The switch 220 also provides a form of routing called "dynamic routing" for communication patterns that are not necessarily known at compile time. In dynamic routing, circuitry in the switch 220 determines which input and output ports to connect based on header information in the data being dynamically routed. A tile can send a message to any other tile by generating the appropriate address information in the message header. The tiles along the route between the source and destination tiles use a predetermined routing approach (e.g., shortest Manhattan Routing). The number of hops along a route is deterministic but the latency depends on the congestion at each tile along the route. Examples of data traffic that would typically use dynamic routing are memory access traffic (e.g., to handle a cache miss) or interrupt messages.

The dynamic network messages can use fixed length messages, or variable length messages whose length is indicated in the header information. Alternatively, a predetermined tag can indicate the end of a variable length message. Variable length messages reduce fragmentation.

The switch 220 can include dedicated circuitry for implementing each of these static and dynamic routing approaches. For example, each tile has a set of data paths, buffers, and switching circuitry for static routing, forming a "static network" for the tiles; and each tile has a set of data paths, buffers, and switching circuitry for dynamic routing, forming a "dynamic network" for the tiles. In this way, the static and dynamic networks can operate independently. A switch for the static network is called a "static switch"; and a switch for the dynamic network is called a "dynamic switch." There can also be multiple static networks and multiple dynamic networks operating independently. For example, one of the dynamic networks can be reserved as a memory network for handling traffic between tile memories, and to/from on-chip or off-chip memories. Another network may be reserved for data associated with a "supervisory state" in which certain actions or resources area reserved for a supervisor entity.

As described above, the switch 220 is coupled to the processor 200 over processor coupling wires 230. For fast (e.g., low latency) communication between tiles of neighboring processors, the coupling wires 230 can be integrated directly into the pipeline 208. The processor 200 can communicate with the switch 220 using distinct opcodes to distinguish between accesses to the static and dynamic network ports. Alternatively, the instructions can use register names to refer to switch ports.

For example, the processor can send or receive data by writing to or reading from a register interface that is directly mapped to the input buffers 222 of the switch 220. For data going to or coming from the processor 200, a switch instruction indicates that the switch 220 should couple data to or from a selected register or bypass path of the pipeline 208 over a register mapped pipeline integrated switch interface 232. This pipeline integration allows data to be available to the switch 200 the moment an instruction is executed and the register value is available. In the next cycle the same data could appear at an input buffer of another tile.

Figure 2B:
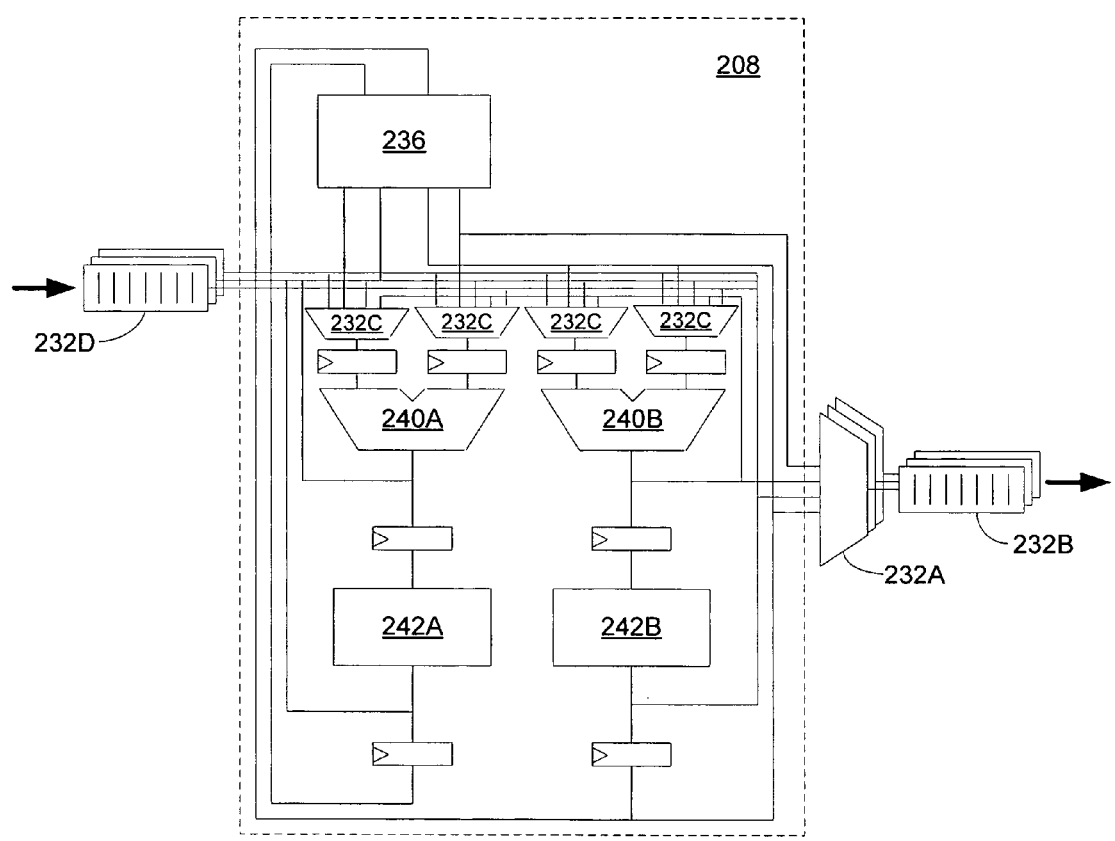
FIG. 2B is a block diagram of a pipeline integrated switch interface.
Figure 3A:
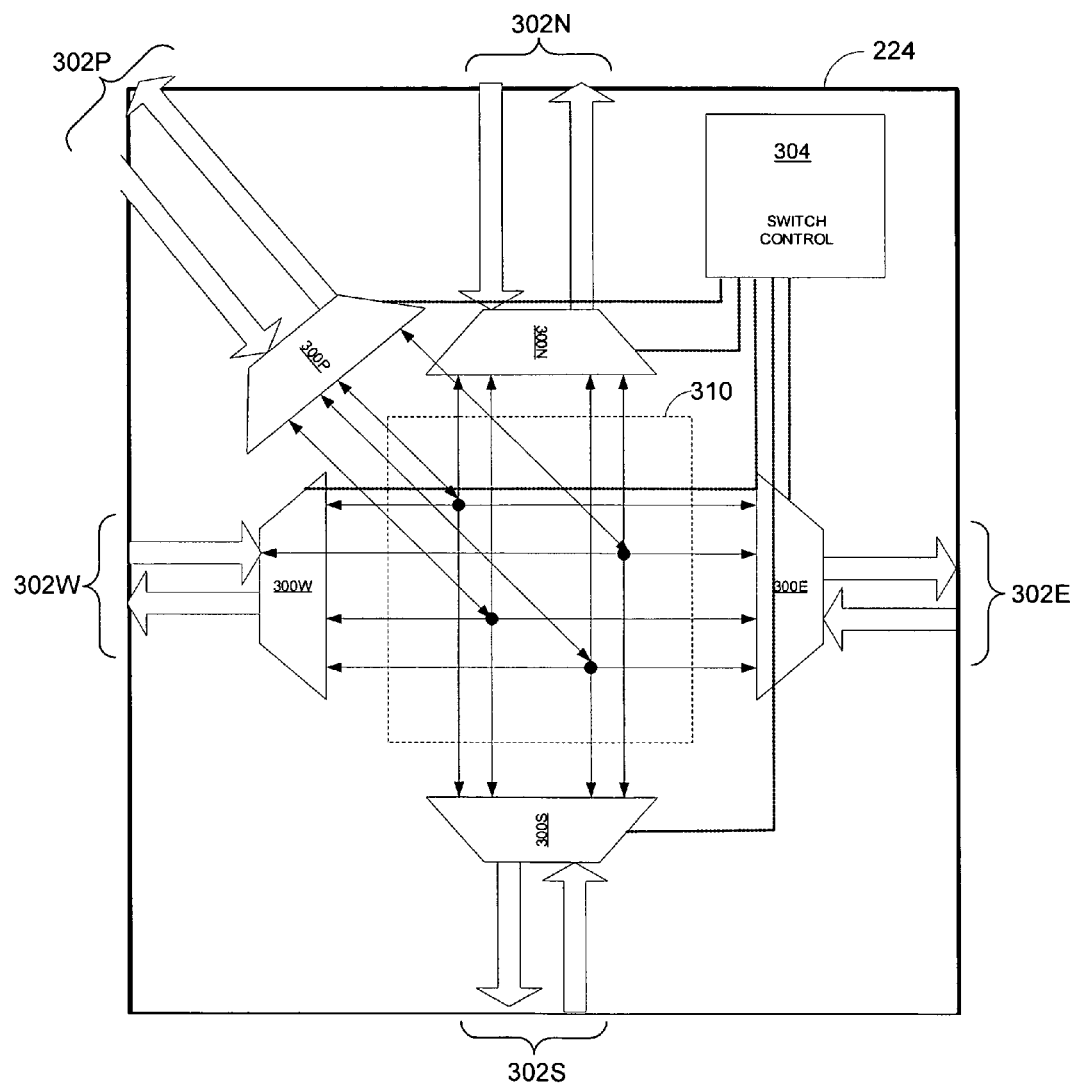
FIGS. 3A and 3B are block diagrams of switching circuitry.

Referring to FIG. 2B, a register mapped pipeline integrated switch interface 232 includes a set of multiplexers 232A and output buffers 232B coupled to different output ports of the static or dynamic switch. The switch interface also includes a set of multiplexers 232C that select data from a register file 236 or any of a set of input buffers 232D coupled to different input ports of the static or dynamic switch. The multiplexers 232C feed the inputs to logic units 240A and 240B. The output buffers 232B and input buffers 232D are mapped to the name space of the register file 236. When the processor 200 reads from a register name mapped to a given switch port, data is taken from the corresponding input buffer 232D. When the processor 200 writes to a register name mapped to a given switch port, data is inserted into the corresponding output buffer 232B. The multiplexers 232A are able to select data from any pipeline stage (e.g., before or after the logic units 240A and 240B, or before or after functional units 242A and 242B) as soon as the value is available. If the processor 200 loads an instruction to read from an empty input buffer 232D or to write to a full output buffer 232B, the processor 200 will stall until it is able to proceed. Referring to FIG. 3A, switching circuitry 224A includes five multiplexers 300N, 300S, 300E, 300W, 300P for coupling to the north tile, south tile, east tile, west tile, and local processor 200, respectively. Five pairs of input and output ports 302N, 302S, 302E, 302W, 302P are connected by parallel data buses to one side of the corresponding multiplexer. The other side of each multiplexer is connected to the other multiplexers over a switch fabric 310. In alternative implementations, the switching circuitry 224 additionally couples data to and from the four diagonally adjacent tiles having a total of 9 pairs of input/output ports. Each of the input and output ports is a parallel port that is wide enough (e.g., 32 bits wide) to couple a data word between the multiplexer data bus and the incoming or outgoing wires 104A and 104B or processor coupling wires 230.

A control module 304 selects which input port and output port are connected in a given cycle. The routing performed by the control module 304 depends on whether the switching circuitry 224 is part of the dynamic network or static network. For the dynamic network, the control module 304 includes circuitry for determining which input and output ports should be connected based on header information in the incoming data.

Figure 3B:
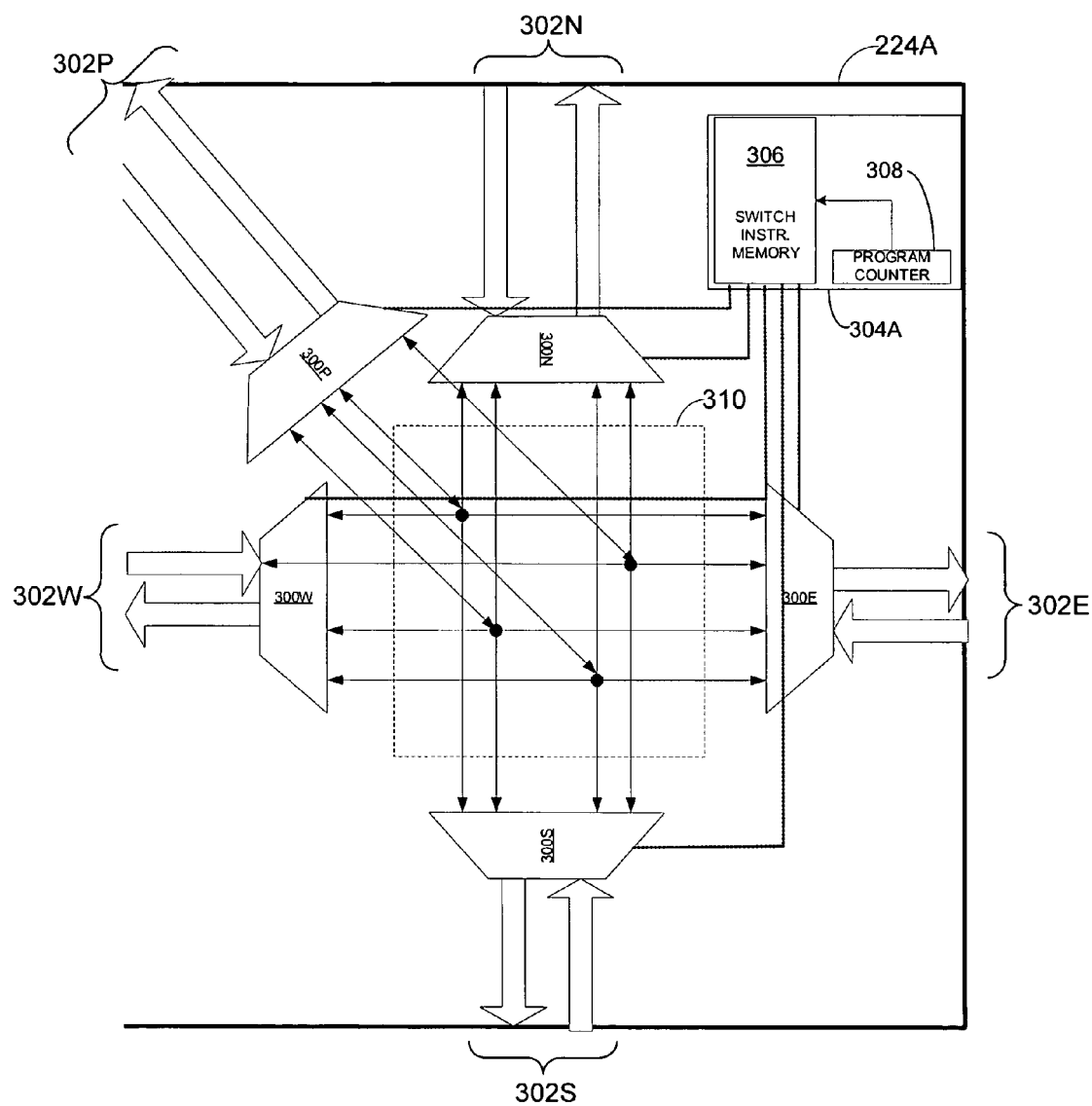

Referring to FIG. 3B, for the static network, the control module 304A of switching circuitry 224A includes a switch instruction memory 306 storing switch instructions that indicate which input and output ports should be connected. A switch instruction stored in the switch instruction memory 306 includes a subinstruction for each output port (in this case, five subinstructions). Each subinstruction represents a multiplexer select value which routes one of five input ports to the corresponding output port.

A program counter 308 steps through the switch instructions, interpreting control information (e.g., a condition code) in the switch instructions to perform actions such as branches or jumps based on program control flow. In a given clock cycle, the control module 304A can enable the multiplexers to move data independently onto any output port from any input port, including multicasting an input port to all output ports, as long as two input ports are not connected to the same output port in the same clock cycle.

The control module 304A is able to function as a switch processor with or without an ALU and registers. The control module 304A can include an ALU and registers to allow in-switch processing of in-flight messages. Optionally, the control module 304A can include other components such as a floating point arithmetic unit, or bit shifter, for example, to perform additional functions. The control module 304A can also be VLIW-type processor and be multithreaded.

The switches 220 include hardware and software mechanisms for providing flow control to ensure that data arriving at a full tile input buffer does not overwrite old data still pending in the buffer or cause deadlock. A switch 220 can include circuitry to detect full/empty states of buffers, and some of the wires in the data paths 104 of the static or dynamic network can be dedicated to communicating flow control information. In the dynamic network, the traffic patterns are unpredictable and there is a need for techniques for deadlock avoidance or deadlock detection and recovery. For example, buffers that become full can be overflowed into memory coupled to the switch 220 or the processor 200, or over one of the networks to off-chip memory. In the static network, the traffic patterns are controlled by the processing of switch instructions in a way that ensures correct delivery of data and avoids deadlock.

In a first approach to flow control for the static network, a processor 200 or switch 220 stalls if it is executing an instruction that attempts to read data from an empty input buffer 222 or from an empty processor output buffer 236, or send data to a tile with a full input buffer 222. This approach ensures correctness in the presence of timing variations introduced by dynamic events such as dynamic memory references and I/O operations.

In a second approach to flow control for the static network, the switch 220 can continue to process subinstructions of a macro switch instruction if data has arrived at the corresponding input buffers, and delay processing subinstructions if the corresponding input buffer is empty. The switch 220 is also notified that an input buffer at a connected tile that receives data from a given output port is full (e.g., via a full/empty bit). The switch 220 is able to continue processing switch instructions for other output ports while suspending only that output port.

In one implementation of this second approach, there is a switch instruction memory 306 (e.g., separate memory units or separate queues within a single memory unit) and program counter 308 for each output port to enable the switch 220 to operate independently on a separate stream of switch instructions for respective output ports. For example, the switch 220 can extract the instruction streams for respective output ports from an incoming macro switch instruction stream that includes subinstructions for the respective output ports. The condition code from a macro switch instruction can be included with each corresponding subinstruction of the extracted instruction streams.

Alternatively, each subinstruction can include its own condition code based on the appropriate program logic. This second approach allows data that can be forwarded without sacrificing correctness to be forwarded without further delay.

1.2 Additional Circuitry

A tile can include additional circuitry embedded within or coupled to the processor 200 and/or switch 220. The configuration of the circuitry in a tile can be controlled by local control information stored in the tile. For example, a module in the tile can be turned on or off or configured into a variety of modes based on the state of a "mode indicator" (e.g., one or more bits) stored in a register or other memory store.

A tile 102 can include various types of memory modules to serve as the instruction memory 204, data memory 206, or as a local memory store for other types of information such as control information for the tile. There can be a small SRAM bank in each tile in addition to a large SRAM bank. There can also be a larger DRAM bank in each tile. Each tile can have mode indicators used to select among these banks. Any of the memory modules can be treated as a cache for a larger memory store outside the tile 102 or the integrated circuit 100. Such external memory (e.g., DRAM) is accessible over high bandwidth paths of one or more dynamic networks. The amount of memory can be chosen to roughly balance the areas devoted to processing and memory, and to match the memory access time and the processor clock.

A tile 102 can include Reconfigurable Logic (RL) that takes operands from registers and writes them back to registers after performing reconfigurable logic operations. The RL can be used for bit-level (or "gate-level") logic, and also for multi-bit-level (e.g., byte-level) logic. The operations performed by the RL can be specified by logic-level instructions supplied to the RL.

Functions such as virtual address translation, caching, global shared memory and memory protection can be implemented by any combination of hardware and software (e.g., processor instructions). A tile 102 can include a translation look-aside buffer (TLB) to translate virtual addresses as they come out of the processor 200 on each tile 102. A mode bit can turn off translation. The events such as cache miss or translation fault can trigger a trap or interrupt to the processor 200, so that the processor 200 can handle it in software. For example, there can be multiple trap lines to the processor 200. Alternatively, there are few trap lines, but there is a trap vector that the processor 200 can access which encodes the type of trap that occurred. There is a mode indicator which can allow selecting whether the software or the hardware handles these events. A hardware cache tag file can export a hit/miss status to the software rather than stalling the processor pipeline.

In a processor 200 in which the switch 220 is integrated into the bypass paths of the processor pipeline 208, the translation is performed before the data is sent (or committed) to the switch (e.g., before being written into a switch buffer to be sent out on any one of the static or dynamic networks). In this way, if there is a translation fault, then the data is not sent and the instruction can be safely aborted. Otherwise, data for which there has been a translation fault could corrupt program execution if sent over a network.

2 Tiled Circuit Programming Overview

A software system for the tiled integrated circuit 100 includes a compiler that is able to schedule instructions in both time and space by generating both processor and switch instructions for arranging the static network. The compiler can also prepare messages to be sent over the dynamic network. The combination of the static network and the pipeline integration enables the compiler to orchestrate a calculation to be performed over multiple tiles with fast register-level communication between tiles. The software system can exploit both coarse-grained parallelism and fine-grained Instruction-Level Parallelism (ILP). In addition, the software system can exploit reconfigurable logic in each tile to construct operations that are uniquely suited for a particular application. This reconfigurable logic can be coded in a hardware description language such as Verilog or VHDL, or in a high-level language such as C.

The operating system (OS) for the integrated circuit 100 can include a Linux-like kernel or a similar kernel running on a single tile 102. Alternatively, the OS can be a distributed OS running on multiple tiles sending messages to each of the processes on each of the tiles.

The compiler can leverage the architectural features of the integrated circuit 100 by partitioning and scheduling ILP or data-level parallelism across the tiles. The compiler is able to automatically parallelize sequential applications across multiple tiles 102. For example, outer loops can be parallelized at a coarse-grained while inner loops can be parallelized at a fine grain, much as in a vectorizing compiler. When the compiler can identify commonly occurring instruction patterns or bit operations, they can be configured into special operations that will run in a single cycle using the reconfigurable logic.

Figure 4:
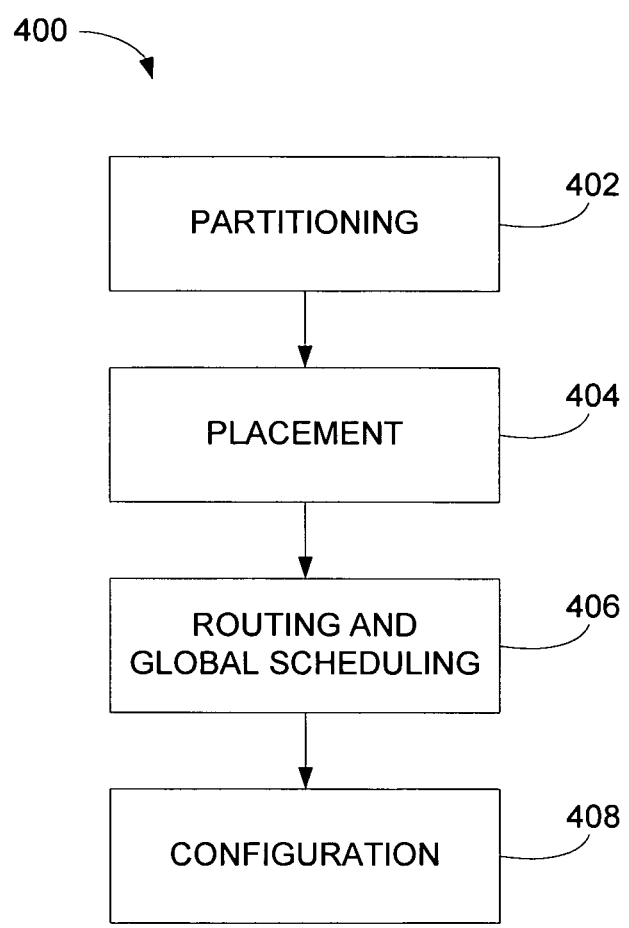
FIG. 4 is a flowchart for a compiling process.

Referring to FIG. 4, a compiling process 400 includes a number of stages. The compiler identifies and partitions for fine grain ILP in program by balancing the benefits of parallelism versus the overheads of communication and synchronization. In a partitioning phase 402, the compiler generates parallel code for a number of threads up to the number of tiles in the integrated circuit 100. In the partitioning phase 402, the compiler assumes an idealized fully-connected switch (an "ideal crossbar"), an unbounded number of virtual registers per tile, and symbolic data references. In a placement phase 404, the compiler removes the idealization of an ideal crossbar by selecting a one-to-one mapping from threads to physical tiles. The placement algorithm attempts to minimize a latency and bandwidth cost measure and can be, e.g., a variant of a VLSI cell placement algorithm. In a routing and global scheduling phase 406, the compiler allocates physical network resources with the goal of minimizing the overall estimated completion time of the program. The compiler output includes a program (e.g., a stream of instructions) for the processor 200 of each participating tile.

In an optional configuration phase 408, the compiler selects an application-specific configuration for reconfigurable logic to perform one or more custom operation. For each custom operation, the configuration compiler generates logic-level instructions for the reconfigurable logic and if necessary rewrites associated processor or switch instructions. For example, a compound operation involving multiple instructions is replaced by a call to the appropriate custom instruction using the reconfigurable logic. The compiler output includes a program (e.g., a stream of instructions) for each tile processor 200 and switch 220, and optional logic-level instructions.

Alternatively, the compiler can generate logic-level instructions based on a separate hardware description language program, as described in more detail below.

3 Additional Features

3.1 Operand Decoupling

As described above, in a first approach to flow control for the static network, a processor 200 or switch 220 stalls until all data to be switched according to a macro switch instruction become available before they are forwarded to their respective output ports. This approach can cause starvation at some ports where data, such as an operand for a processor instruction to be executed in another tile, is available but is not able to make forward progress.

Under certain circumstances, it is a better to allow the input port (or output port) buffers to be decoupled from each other so that each output port can route an operand as soon as the operand is available. As described above, in a second approach to flow control for the static network, there is a switch instruction memory 306 and program counter 308 for each output port to enable the switch 220 to operate independently (e.g., at different rates) on a separate stream of switch instructions for respective output ports.

Under other circumstances, it is dangerous to allow an operand to be allowed to be routed without all operands to be available for all output ports. In certain of these dangerous scenarios, the program order can be violated if operands are allowed to bypass each other, resulting in faulty program execution. This is particularly true when running programs compiled using an ILP compilation strategy. In ILP compilation, individual instructions that can run in parallel are executed in different tiles, and operand values are communicated between tiles. The order in which operand values reach input buffers is critical to the correctness of the program. Often, only the compiler can make such a determination at compile time.

One way to solve this problem is to enable the switch 220 to operate in an "operand decoupling mode" in which the switch instruction streams are processed synchronously. For example, the mode can be controlled using a mode indicator called the Operand Decoupling mode indicator (or the OD mode indicator) that allows the switch 220 to decouple the input buffers in a switch from each other. If this mode indicator is set, then the input buffers are decoupled, and the switch 220 will allow the operands to pass each other. For example, in a group of operands that have been scheduled by the compiler to be switched at the same time (e.g., in the same cycle), some of the operands can be switched before others. If the bit is not set, then the switch 220 processes switch instructions synchronously (in "coupled mode"), stalling if necessary until all operands scheduled to be switched together are available in the input buffers.

The switch 220 (or processor 200) can set the OD mode indicator based on the presence or absence of a tag in the operands. The compiler tags operands that must all appear at the switch input buffers before any is routed with a tag (e.g., a "sequence tag"). All operands that have been tagged as a group have to become available before any is allowed to proceed. The OD mode indicator can be set (directly, or in response to a sequence tag in the data) by an application, by the compiler, by the firmware implemented on the chip, or by a user. The OD mode indicator can also be set over a network (e.g., via the dynamic network). The OD mode indicator can be set once at the beginning of execution, or at the time of shipment of the chip, or at the time of shipment of the system in which the chip is embedded. An OD mode indicator can be provided per switch, per tile, or for the entire chip.

3.2 Pipeline Integration

Bypass paths in pipelines short circuit values from one pipeline stage to another without the need to transmit the values to the register file or to memory each time. The bypass paths in a processor are thus critical resources for shuttling values around between various stages such as ALUs, register files, load-store queues, writeback stages, and so on. As described above, a register mapped interface is able to integrate the switch 220 into the bypass paths of the processor pipeline 208. Register mapped interfaces allow the processor 200 to use register names to refer to buffers that couple data into or out of the static or dynamic networks. Values may be coupled from a processor bypass path to a switch output port, or values may be read from the switch into the processor bypass paths.

Integration of the switch 220 into the bypass paths of the pipeline 208 enables the values that are destined to the switch 220 from the processor 200 to be picked directly from the processor pipeline 208 as soon as they are produced. For example, data values from the pipeline 208 can be sent to switch buffers 232B directly from the processor's bypass paths, even before the values are written to the register file 236 (FIG. 2B) at a writeback stage.

The pipeline integrated switch enables a value computed by an ALU of a given tile to be used as an operand in a neighboring tile's ALU with extremely low latency, e.g., in 1 to 3 cycles, as opposed to 5 or 10 cycles, which would be the case if the value was picked from the pipeline in the writeback stage of the pipeline. This low latency transfer of single word operands between tiles is an important aspect of enabling an ILP (instruction level parallelism) compiler to compile programs written in sequential C, C++ or other high level languages to multiple tiles.

Register file size can be increased from the size used by other processors (which may have 8 to 32 registers), for example, to 64 or more registers, because some of the register name space is used up to name switch buffers.

In VLIW processors, multiple subinstructions in a macroinstruction may attempt to read or write to the switch buffers. If multiple subinstructions in a macroinstruction try to write to a register name mapped to the same switch buffer, there is a conflict. The compiler avoids such conflicts in scheduling the VLIW instructions. Alternatively, hardware can be present in the tile to serialize the two writes into the switch buffers allowing both to take place sequentially without a conflict. Multiple instructions in a macroinstruction are able to read from the same switch buffer without a conflict.

When an outgoing value is coupled from the processor 200 to the switch 220, the processor instruction may include a switch register specifier denoting one of several output registers. The specified output register may be linked to a static coupled switch (with the OD mode indicator set to coupled mode), a static decoupled switch (with the OD mode indicator set to operand decoupling mode), or to a dynamic network switch.

For increased speed, the switch register specifier is able to directly specify a register of a neighboring processor. A direct name identifying the register can be included, or there can be a directional mode indicator in the instruction that allows the register name to be interpreted based on the name space of a neighboring tile. For example, a directional mode indicator can be 2 bits corresponding to a register in a tile in the east, west, north, or south direction. Directional mode indicators allow the name space of a register specifier to be inferred to be that of a neighboring tile. Particularly for a slow clocked system, it is useful to avoid a multi-hop near neighbor latency by using a directional mode indicator to enable a single-hop communication event from one tile to a neighboring tile.

Alternatively, instead of sending a processor value to a register on the same tile using a register specifier, or to a neighboring or other tile's register or ALU, a processor value can be sent to a memory using a memory specifier, or to an I/O port using an I/O specifier.

When an incoming value is coupled from the switch to the processor, the processor instruction may include a register specifier denoting one of several input registers from the switch. These input registers serve to synchronize the processor pipeline with the switch even if the switch is running in decoupled mode. There can be more input ports than just the 4 directions (north, south, east, and west). For example, there can be multiple networks, and there can also be communication paths forming "hyperlinks" that skip multiple tiles (e.g., described below in section 3.6).

Another mode indicator called the Processor Switch Coupling (PSC) mode indicator indicates whether program counters of the processor 200 and switch 220 are to be coupled. If this PSC mode indicator is set, the processor and the switch program counters are coupled and the two are incremented synchronously. For example, both the processor and switch pipelines are stalled if either is stalled.

It is useful for some of these mode indicators, in particular, the directional mode indicators, to be linked to the clock speed of the integrated circuit 100. For example, a given mode may be more appropriate for a given clock speed. In some cases, a tile is allowed to transfer data over hyperlinks to non-neighbor processors (e.g., by allowing a compiler to have visibility of the hyperlinks) only when the clock speed is lower than a predetermined rate. This is because hyperlinks to tiles, which are normally two or more hops away in a two dimensional (east, west, south, north) mesh network, will traverse longer data paths. Data that traverses a longer data path will take longer to reach its destination. Therefore, in some cases, these longer delays limit the integrated circuit 100 to operating with slower clock speeds when hyperlinks are used than the clock speeds that may be available when hyperlinks are not used. In some implementations, the clock speed of the integrated circuit 100 is itself controlled by one or more mode indicators.

3.3 Reconfigurable Logic

As described above, a tile 102 can include Reconfigurable Logic (RL) that is able to perform reconfigurable bit-level (or "gate-level") logic operations or multi-bit-level logic operations. RL enables each tile to have highly dense logic implemented in an energy efficient manner. For example, logic operations can be performed to implement functions such as memory controllers in the tiles without needing to expend many cycles to perform simple bit-level logic operations such bit shifts. The RL enables the integrated circuit 100 to perform more logic operations in a single clock cycle in a way that is selectable at compile time by a user or in a way that is customizable to an application. FIGS. 5A-5F show exemplary configurations for including RL 500 in a tile 102.

Figure 5A:
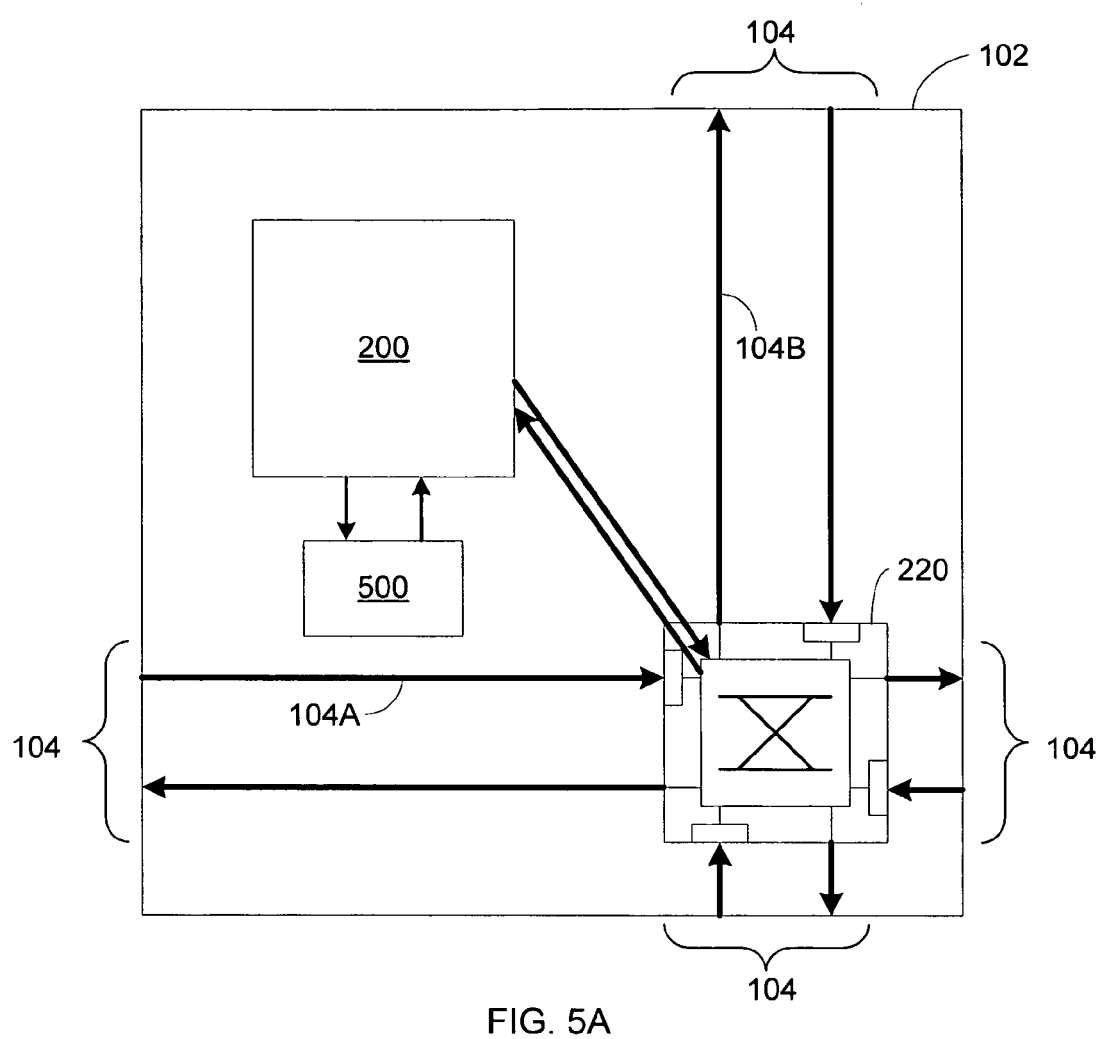
FIGS. 5A-5F are block diagrams showing reconfigurable logic in the integrated circuit.

Referring to FIG. 5A, the RL 500 is an adjunct to the processor 200. In this configuration, a user may define special instructions in a hardware description language (e.g., verilog) for the RL 500. The RL 500 is able to operate on a value from a register in the processor 200 and write the result back into a register in the processor 200.

Figure 5B:
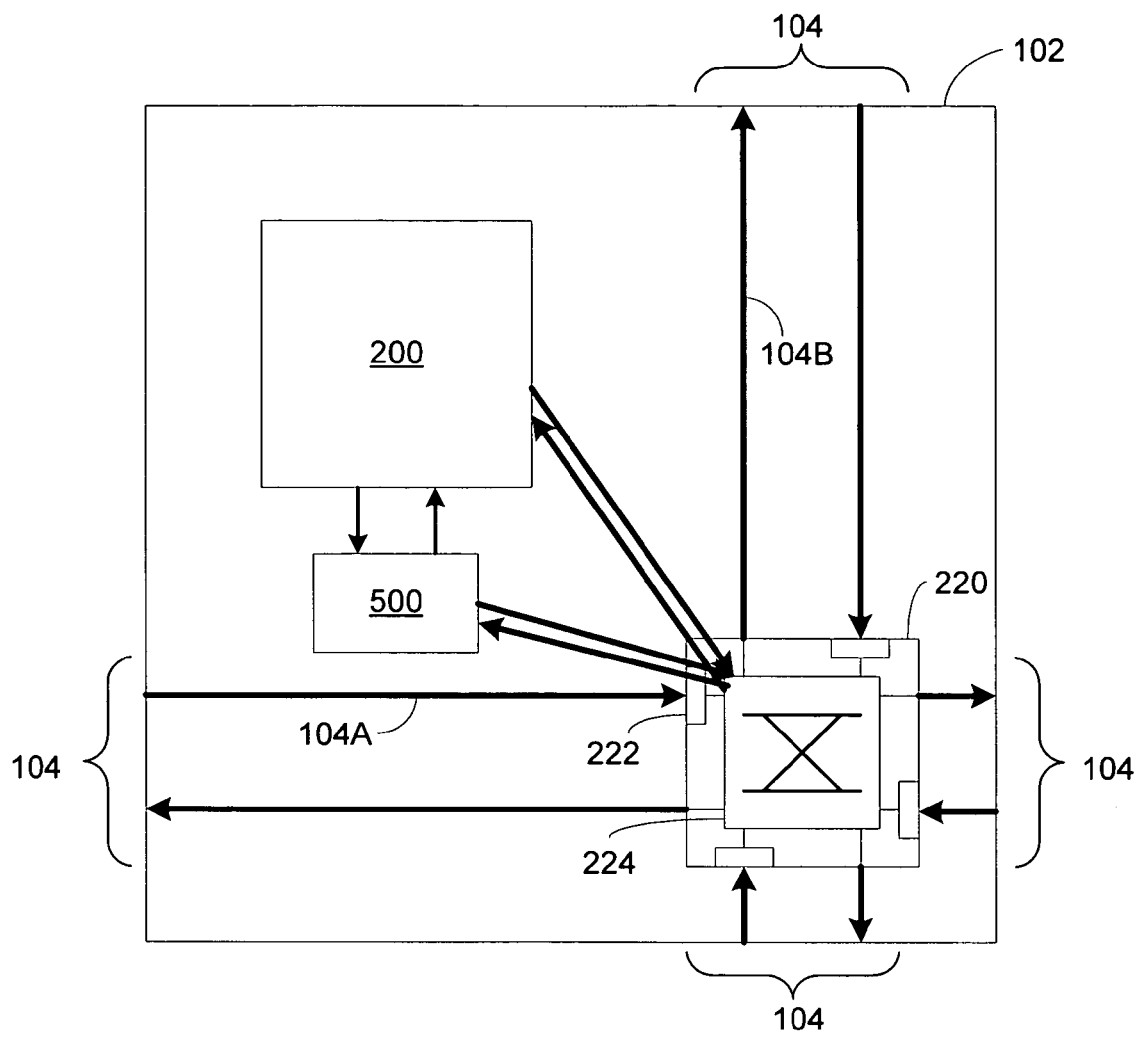

Referring to FIG. 5B, the RL 500 includes one or more connections to the switch 220. The connections can include independent bit-level connections. Through the switch 220, the RL 500 is able to connect to RL of other tiles, so that the RL in multiple switches can be "ganged together" to perform operations cooperatively. The RL 500 can also include connections to the processor 200. The connections between the RL 500 and the RL of other tiles can go through pipeline registers and multiplexers so that the compiler software can orchestrate the RL operations.

Figure 5C:
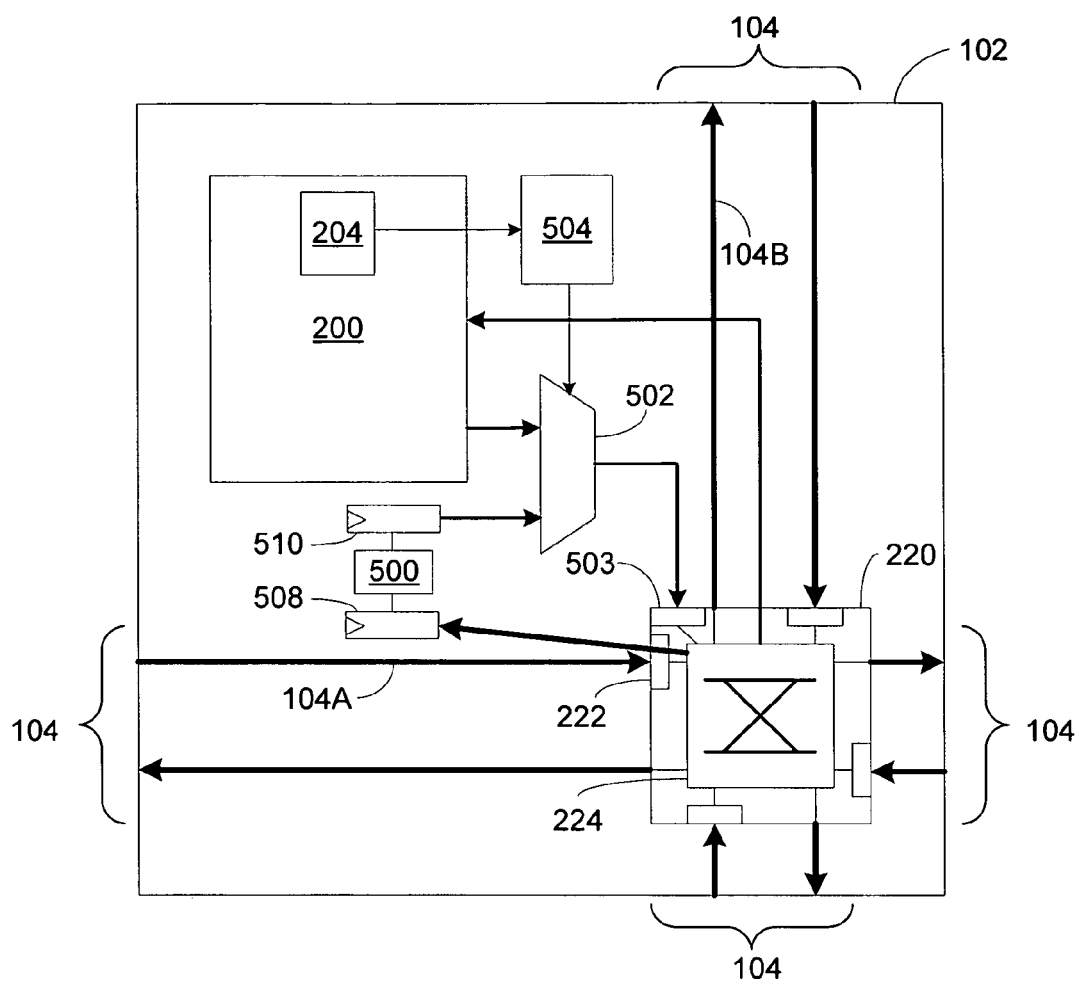

Referring to FIG. 5C, the tile 102 includes a multiplexer 502 that selects data for a switch input buffer 503 from either the processor 200 or the RL 500 based on a selection signal $S_i$. The selection signal $S_i$ is generated from decode logic 504 that decodes an instruction from the instruction memory 204. The logic-level instructions for configuring the RL can come from the processor 200, from a separate FIFO shift register (that can operate at a slow clock speed), from the static or dynamic network, or from memory on the tile using load-store instructions. The RL takes input from an input register 508 and provides a result to an output register 510. Data from the switch 220 can also be provided to either the processor 200 or the RL 500.

Figure 5D:
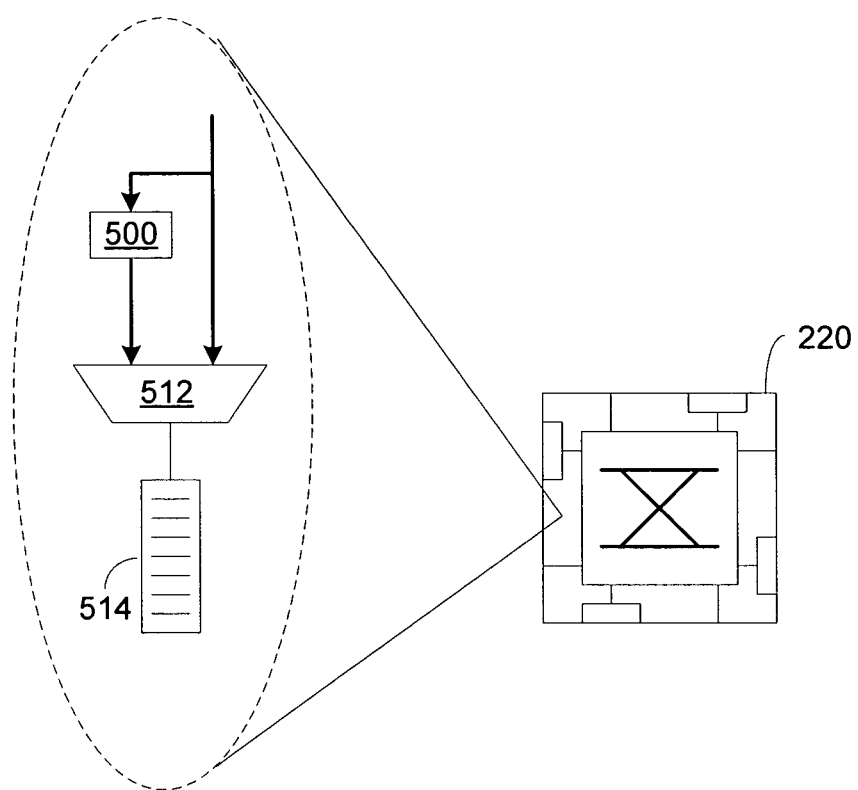

Referring to FIG. 5D, RL 500 is included in a switch 220 as optional data processing logic. A multiplexer 512 in the switch 220 is able to select whether RL 500 operates upon data to be provided to an output buffer 514.

Figure 5E:
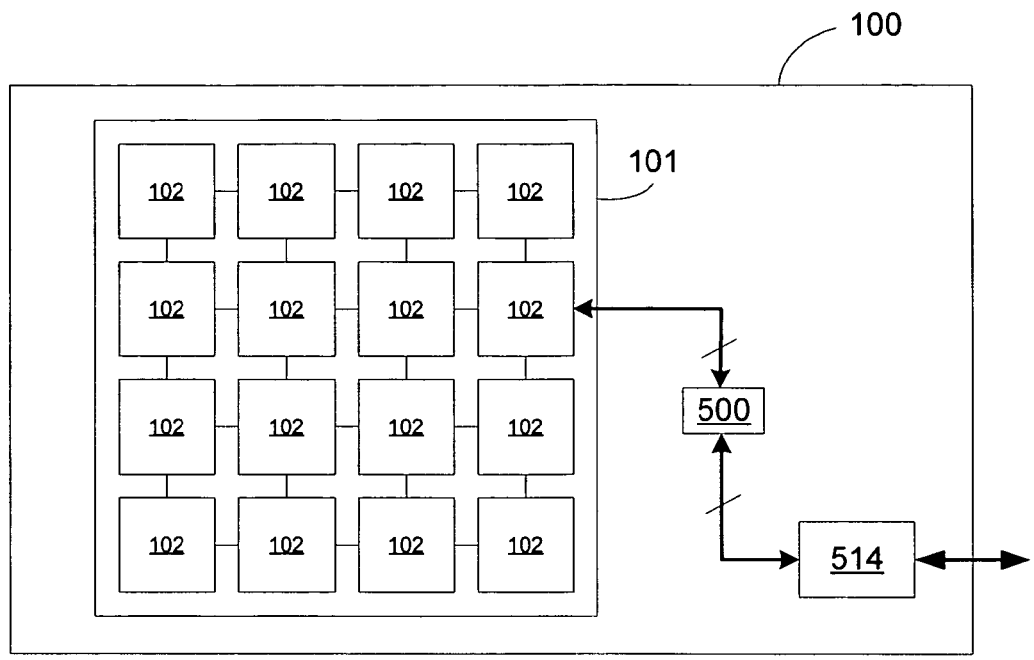
Figure 5F:
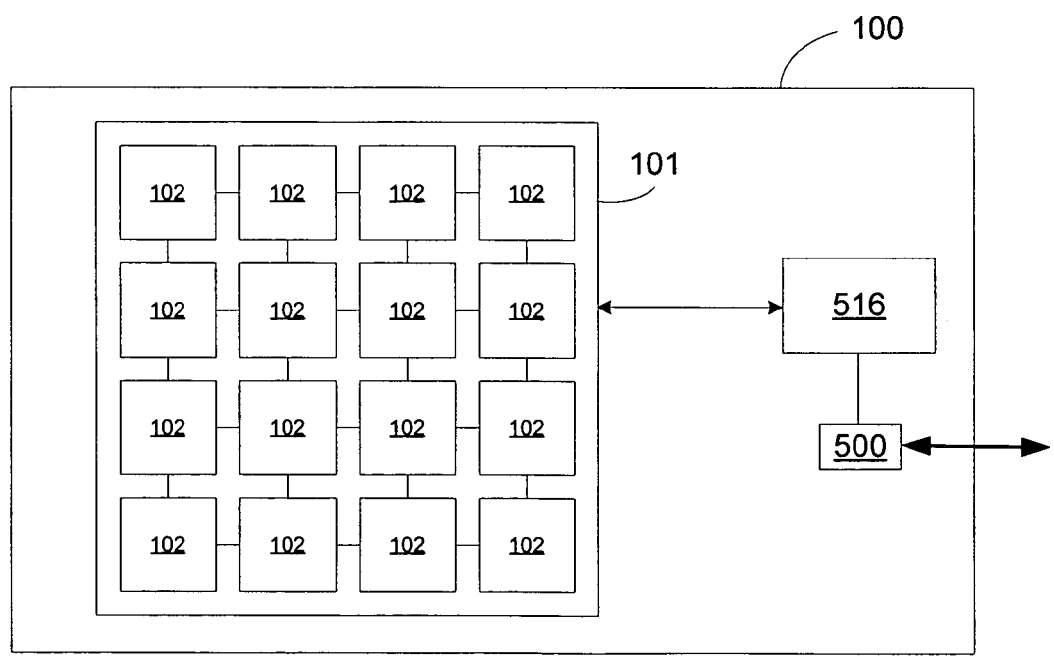

Referring to FIGS. 5E and 5F, RL 500 is optionally included at the boundary of the integrated circuit 100. FIG. 5E shows RL 500 between the array of tiles 101 and a serial interface 514. In this example, the GRL 500 connects to the switch of a tile at the edge of the array 101. FIG. 5F shows RL 500 providing an interface to an on-chip memory 516 for storing, e.g., configuration information.

Other configurations are possible for including RL 500 in a tile 102. For example, RL can be included in the processor pipeline 208 and configured to perform various operations on operands (e.g., the RL can be configured as an ALU).

The operation of the RL can be configured based on logic-level instructions stored in a memory loaded by the processor 200, or based on mode information stored in a register loaded by the processor 200, for example.

3.4 Direct Memory Access

The static and dynamic networks transport data among buffers in the switches. The buffers are used as first-in-first-out (FIFO) queues that are able to pour data into various sinks on the tile, or receive data from various sources on the tile. The processor 200 on a tile can be a source or sink of data to or from a buffer in the switch in the same tile or in a neighboring tile. For example, a buffer can be coupled to a register that the processor 200 can write to or read from. In some cases, a processor 200 may read a data word from the switch buffer and execute an instruction to store that data word in memory (e.g., either in a local cache in the tile, or in a memory external to the tiles 102 via the dynamic network).

In other cases, a larger amount of memory (e.g., multiple words) may need to be stored in memory. Using a direct memory access (DMA) approach, a block of data including multiple words can be stored in memory without requiring the processor to execute an instruction to store each word of the data (or each segment of data whose size is smaller than or equal to the size of a cache line). The processor executes one or more instructions to set up the DMA transfer for outgoing DMA. For example, the processor writes a start address and an end address of the data block to be transferred into one or more registers. Alternatively, the processor writes a start address and the size of the data block into registers.

A DMA controller in the tile transfers the data in the background without processor intervention, enabling the processor to execute other instructions during the DMA transfer. At other times, such as during a cache miss, the size of data that is sent into the cache of a tile without processor intervention is limited to one cache line (e.g., around 16 to 128 bytes). The size of the data block transferred in a DMA transfer can be much larger than a cache line (e.g., 4 Kbytes). This DMA approach can be indicated by control information within the data (e.g., the data can contain a DMA tag that determines whether the data is destined for a register (to be handled by the processor 200), or for direct memory transfer. In the static network, the tag can be appended to the data. In the case of the dynamic network, since the data is in the form of a packet with a header, the tag can be included in the header.

If the DMA tag is set, the data arriving at the switch of a destination tile is deposited into a DMA queue and the data is passed directly into a cache or static memory without involving the processor 200. If the DMA tag is not set, the data is put into a FIFO coupled to the registers of the processor 200. The value of this twofold processing is that when the data is to go into memory, the processor does not have to be involved in the receipt of the data. The DMA tag is set by the sender of the data.

In an alternative implementation, the DMA tag is not contained in the data (or its header), rather there is a mode indicator called the DMA mode indicator in the appropriate network port (or in the tile). If this DMA mode indicator is set, then the data is directed to memory.

3.5 Serial Orchestration

The data paths of the static network and the dynamic network are parallel communication links, which are able to transport multi-bit data words. These communication links can be multiplexed down to a serial communication link to couple to a serial I/O device. For example, data paths leaving a switch (e.g., on the periphery of the network) corresponding to one or more static networks and one or more dynamic networks are multiplexed down (individually or together) and connected to one or more channels of an interface module. The interface module is able to multiplex the traffic onto a high speed serial link.

The interface module is able to mediate between the static and dynamic network protocols of the switch and a serial protocol of the serial link. The interface module can provide an interface to a network protocol such as SerDes, PCI Express, PCI-X, Fibre Channel, infiniband, rocket I/O, rapid I/O, GPIO, SPIE, hypertransport, XAUI, or Ethernet. Alternatively, the interface module can act as a memory controller interface to a memory using a memory protocol such as DDRII, QDR, SRAM, LA1, RLDRAM, SDRAM, or FBDIMM. The high speed serial links can use any of a variety of physical communication media such as differential pairs, or optical links. There can be reconfigurable logic placed between an I/O device and the on-chip static network or dynamic network.

The tiles with switches coupled to a network interface module can be strategically located around the periphery of the integrated circuit 100. For example, multiple network interface modules can be placed at the corners of a rectangular array of tiles. Optionally, multiple static or dynamic network interfaces from multiple tiles on one side of the array of tiles are multiplexed together and connected to a single memory interface to build a wide memory interface.

3.6 Hyperlinks

Although a common configuration for the tiles 101 is a mesh network with near neighbor connections, there are other network topologies that can be useful as well. In one class of these topologies, each tile is connected not just to near neighbors, but to some distant tiles as well. These additional connections reduce the diameter of the network in hops between tiles (network nodes). For example, nodes may be connected to nodes 1 hop away and to nodes that are 4 hops away as well. Other patterns may be chosen, for example, adding a single-hop connection between all nodes that are 8 hops away from each other. Such connections or "links" that connect nodes that are physically distant from each other are called hyperlinks.

This network connection pattern is exposed to the compiler in the form of a graph. The compiler takes advantage of the topology in its partitioning and routing and global scheduling phases to map the communication among the tiles. By mapping critical path communication onto hyperlinks, compilers can reduce the amount of time it takes for computations to complete. Computations involving high data volume are mapped to near neighbor paths, while critical path computations are mapped to hyper links.

There can be multiple subinstructions in a macro switch instructions corresponding to each of the outputs that an operand value can go to—E, W, N S, hyperlink E, hyperlink W, hyperlink N, hyperlink S. There can also be additional diagonal hyperlinks.

3.7 Control Information

Control information, such as the mode indicators described above, can be used to modify the behavior of the processor 200, switch 220 or other functional elements within a tile 102. In addition to control information in the form of mode indicators stored in a tile, control information can be inserted into data (or "messages") sent on the static and/or dynamic networks by a user (e.g., based on a high level program), or by a compiler when executable code is generated for the tiles. The control information can also be generated in response to events, such as automatic hardware generated messages (e.g., cache misses) outgoing from a tile into the network. The control information can be in the form of a tag that is appended onto a message. The control information can be computed as a message is being processed using control logic that can also be reconfigurable logic.

In some cases, the control information associated with a message is generated from a set of mode indicators stored in a memory table, or generated is generated by reconfigurable logic, or from information stored in a configuration register that is preloaded at boot time, or from information loaded from memory at runtime.

Figure 6A:
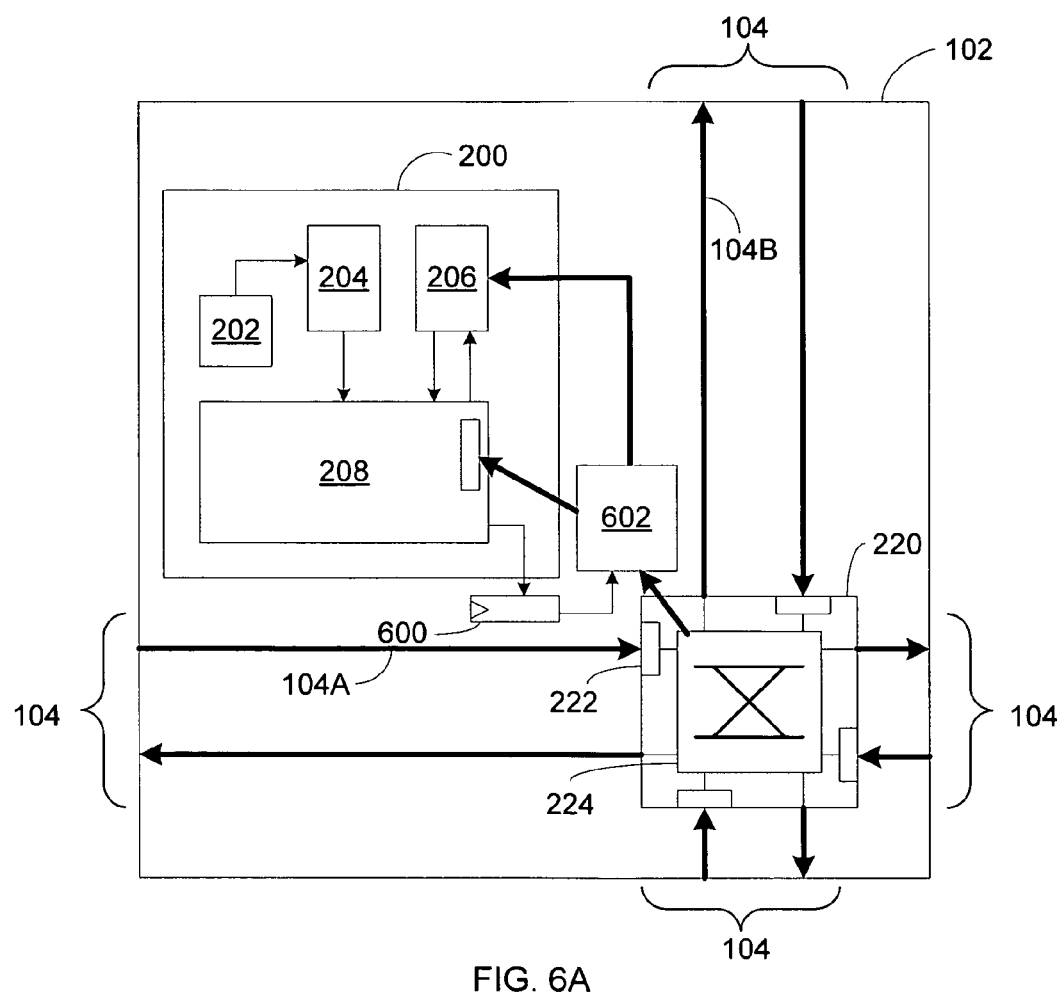
FIGS. 6A-6C are block diagrams of tile circuitry.

Referring to FIG. 6A, the processor 200 sets control information in a mode register 600 which determines how configuration logic 602 will behave. Then, when a message (e.g., a cache miss return message) arrives from the network, the message header is operated upon by the configuration logic 602. The logic 602 is able to modify or "spoof" the cache miss handling in one of many ways that is determined by the setting in the mode register 600. This technique can be used, for example, to set the source address for that message to be different than is present in the message (i.e., spoof the receiver into believing that the message is from a source other than the one that the message came from). It can also be used to change other information in the message header. The control information in the mode register 600 can also enable a cache controller 604 to accept data from the network and directly deposit the data into a local cache 606 without requiring the processor 200 to handle the data, as in the DMA technique described above.

Figure 6B:
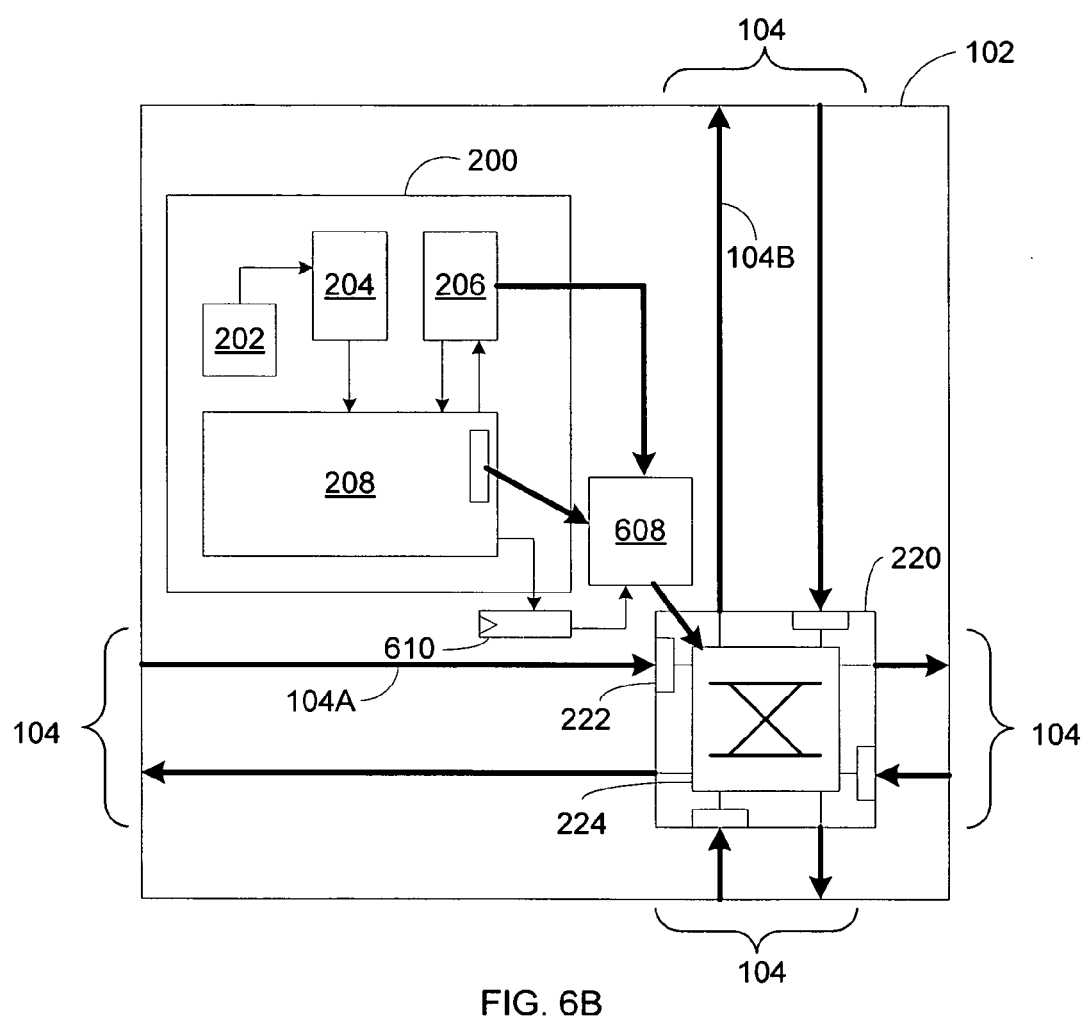

The tile configuration shown in FIG. 6B performs the converse function. Information in an outgoing message can be modified by configuration logic 608 according to control information in a mode register 610. The logic 608 is able to set or modify either control information in a message header or message data. For example, the logic 608 can set the address bits identifying where the message should be going. One useful application of this technique is to set the destination of the cache misses to go to an external memory, or to a level 3 (L3) cache, or to a level 2 (L2) cache, or to be serviced by another tile 102 in the integrated circuit 100.

A tile can also use mode registers and configuration logic to perform both functions shown in FIG. 6A and FIG. 6B.

Figure 6C:
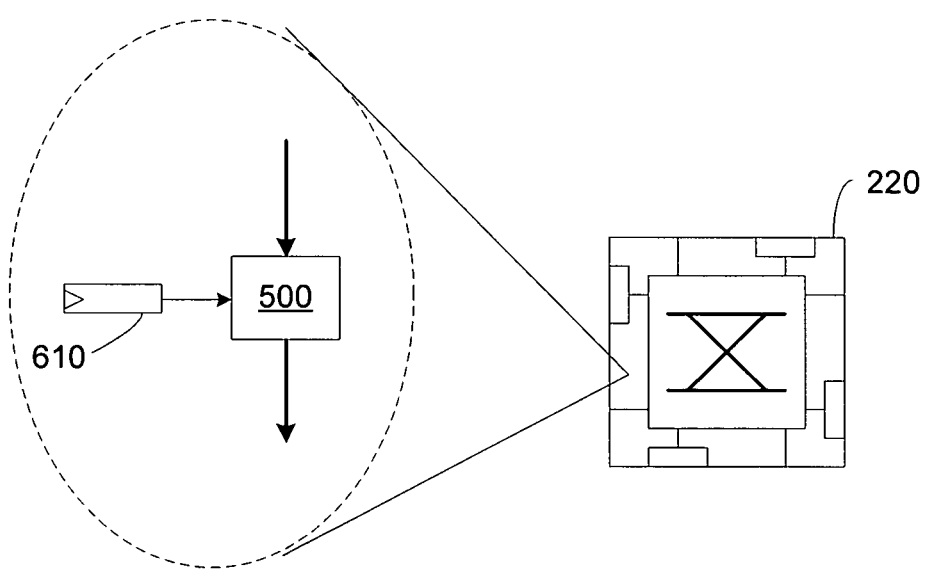

FIG. 6C shows a switch 220 including configuration logic 612 configured by control information in a mode register 614. The configuration logic 612 is in the path of a message as it traverses the switch 220. The control information in the mode register 614 can be set by the processor 200.

There are many applications of such modification of message headers of incoming or outgoing messages. Shared memory implementations can redirect messages to different destinations than those originally intended. Prefetching semantics can be changed—for example, loads can be changed to blocking or non blocking. Cache misses can be redirected. Helper caches can be implemented by having a tile or tiles work as helper processes and send fetched words to the main cache, whether the main cache is expecting the words or not.

3.8 Mode Bit Stream

The tiled architecture can include a large number of mode indicators. These mode indicators can be set up at configuration time, or at run time over the network, or by the processor (e.g., by writing into mode registers), or from cache at run time.

Each tile can have a set of mode indicators. The mode indicators of each tile can be connected in a serial chain (e.g., as a daisy chain) with the mode indicators from the other tiles and data can be streamed from an off-chip or on-chip source (e.g., a ROM, compact flash memory, an EPROM, flash memory, JTAG interface, or network interface) to the on-chip chain as a stream of mode bits. Alternatively, flash memory or ROM can be built into each integrated circuit 100 to preprogram these mode indicators into the integrated circuit.

3.9 Content Addressable Memory

Figure 7:
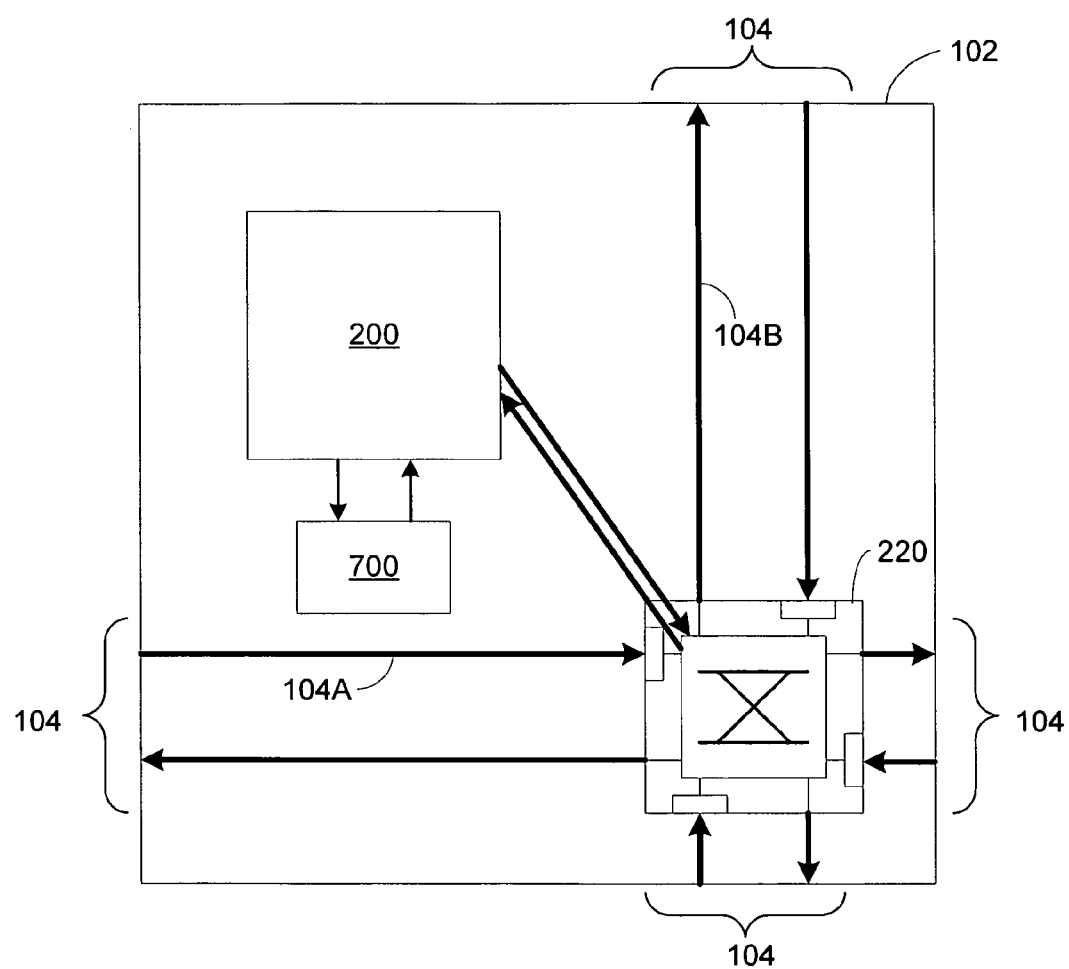
FIG. 7 is a block diagram of tile circuitry including a content addressable memory.

Referring to FIG. 7, one or more tiles can contain a content addressable memory (CAM) 700. The CAM 700 can be associated with the processor 200 and/or the switch 220. The processor 200 provides a value which is sent to the CAM 700 and if there is a match between the provided value and a first value (sometimes called a tag) stored in the CAM 700, the CAM 700 optionally provides a second value associated with the first value, e.g., the address of the value, and asserts a signal indicating a match was found. Alternatively, the CAM 700 can assert a signal or provide an interrupt only if a match was not found. The processor 200 responds to the asserted signal by taking an interrupt or trap or branch, for example, or the processor 200 may continue normally in some cases. The processor 200 can optionally load the second value into a register if there is a match. The values stored in the CAM 700 can be used, for example, to construct a user-defined cache structure. To construct a cache, addresses or portions of addresses are stored as the first value or tag, and the associated data is stored as the second value.

3.10 Power Orchestration

A tile can process instructions for controlling power consumption in the tile. For example, the operation of the processor 200 and switch 220 can be individually controlled using power down (or "sleep") modes. The switch 220 is able to enter a power down mode in which it does not process switch instructions, and can be woken up when there is any message on any one of the switch ports. Power down mode for the switch 220 is entered, for example, by the processor 200 in that tile executing a power down instruction. An instruction can enable a tile to be woken up depending on arrival of a message at a particular switch port, or upon receiving a particular type of a message, or upon receiving a message after a given number of clock cycles. Other power down modes exist to control power consumption of other functional units in the tile, such as the processor 200.

Different types of power down modes reduce power consumption in different ways. For example, one type of power down mode switches off the clock input to a tile. Another type of power down mode slows down the clock frequency at the tile by some amount. Another type of power down mode shuts off the power supply to the tile completely.

During a power down mode in a tile, a timer such as a counter is able to keep counting while other circuitry is idle. In one power mode, the response to a message depends on the value in the counter that is counting within the tile. Alternatively, the response depends on the value in the message, or on a combination of the value in the message and the value in the counter. The wake up of the tile can happen when the counter reaches a given preset value that is set by the instruction that sets the tile into power down mode. The wake up can happen a number of clock cycles after a wakeup message arrives, where the number can be included in the wake up message.

All of the above can happen individually to the processor 200 or the switch 220. This way, the switch 220 can be kept awake while the processor 200 (including the pipeline, program counter, memories, etc.) is powered down.

Waking up of the tile can happen on other events. For example, there can be a separate wake up line. A wakeup line can be common to an entire row or column of tiles. The wakeup line can be common to the entire array of tiles 101, or the entire integrated circuit 100.

The modularity of the tile configuration facilitates power and clock sub-networks that individually couple each tile 102. Thus, clock gating and voltage scaling can be performed at the granularity of a tile. A tile 102 includes stalling logic which stalls the tile 102, for example, when it executes a blocked communication instruction. This stalling logic can be used to control the power to each tile 102. The number of data items in the network queues can also be used to increase or decrease the clock frequency at specific tiles (or shut the clocks entirely to some of the ALUs or memories in some tiles).

The compiler can also slow down the clock of components and tiles in the paths of computations that are not in the critical paths. Bitwidth analysis can also be used to facilitate powerdown.

3.11 Multiple Processor Instruction Streams

There are a variety of ways in which a tile 102 is able to process multiple instruction streams. A tile 102 is able to process an instruction stream for the processor 200 and an instruction stream for the switch 220. In the operand decoupling mode described above, the switch 220 processes multiple instruction streams (e.g., derived from a macro instruction stream) using multiple program counters to switch data for multiple output ports independently. These separate processor and switch instruction streams provides a form of concurrency in which a tile can execute computations and switch data in the same clock cycle.

In another form of concurrency, some or all of the tiles can include a processor 200 that is configured to process multiple instruction streams. The multiple instruction streams can be derived from a common macro instruction stream such as in a VLIW processor, or can be provided as separate threads. The processor 200 can include multiple logic units that process a corresponding one of the instruction streams, based on a common program counter as in a VLIW processor, or based on separate program counters as in a multithreaded processor. The processor 200 can also include multiple register files each associated with a corresponding one of the instruction streams. These multiple processor instruction streams provide a form of concurrency in which a tile can execute multiple computations in same clock cycle.

The multiple logic units can include, for example, one or more of an arithmetic logic unit, an arithmetic unit, a multiply accumulate unit, a multiply add unit, a vector unit, a load or store unit, or a branch unit. The logic units can also include units that interact with the switch, such as a switch read unit, which reads data received by the switch, or a switch write unit, which stores data that is to be sent over the switch. For example, a switch write unit can include a FIFO buffer or a register.

Figure 8A:
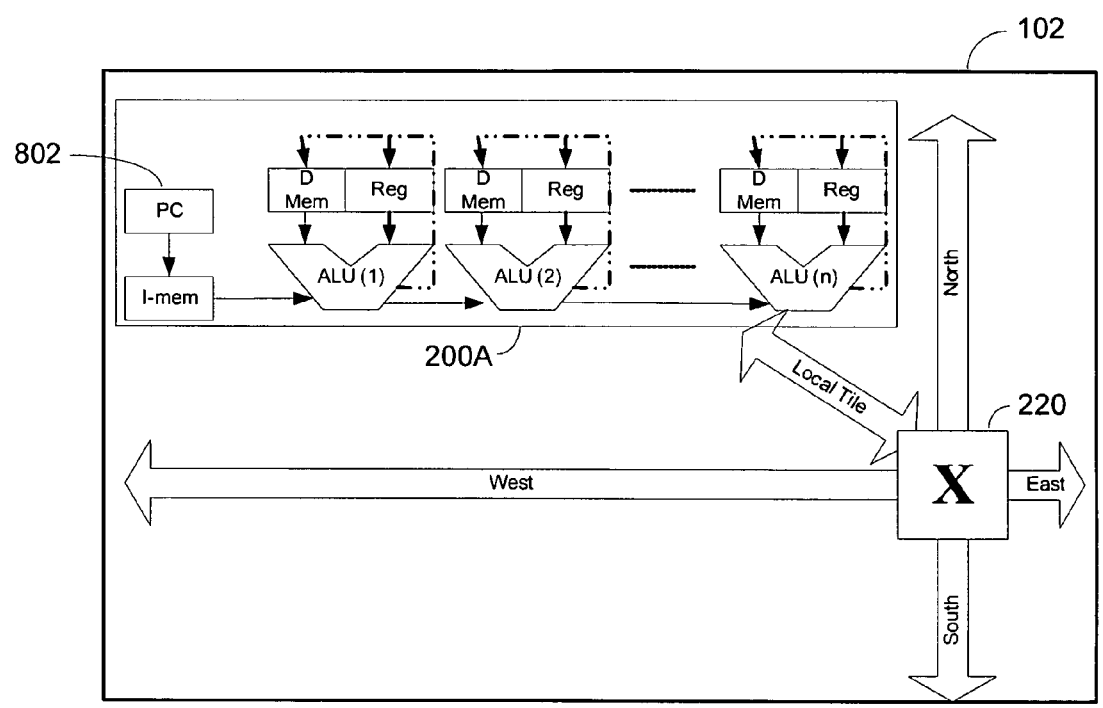
FIG. 8A is a block diagram of a VLIW processor.

In the case of a VLIW processor, the processor 200 is configured to execute instructions taking into account interactions with the switch 220. For example, the subinstructions of a VLIW instruction are executed together; therefore, if some subinstructions are reading from or writing to a port of the switch, the processor may need to stall execution of the VLIW instruction if a subinstruction is temporarily unable to read from or write to a port of the switch. FIG. 8A shows an example of a tile 102 including a VLIW processor 200A having n ALUs (ALU(1)-ALU(n)) that operate based on a common program counter 802.

Figure 8B:
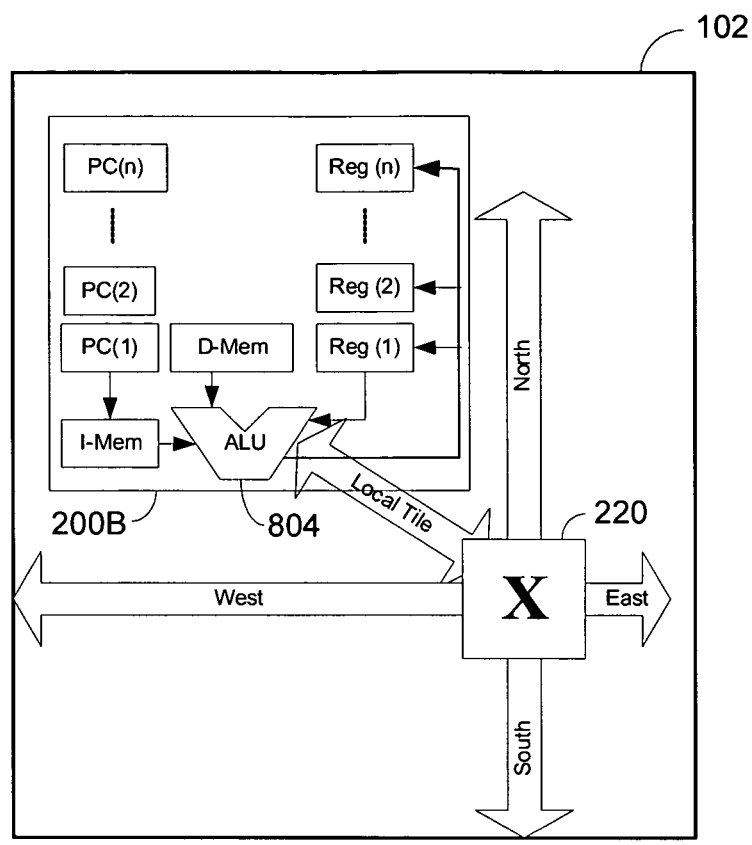
FIG. 8B is a block diagram of a multithreaded processor.

There can be a long latency associated with certain tasks such as accessing memory, sending data across the network, an synchronizing multiple tiles. When one thread of a multi-threaded processor is executing an instruction involving one of these tasks, another thread can perform another task so that the latency associated with those tasks are overlapped. FIG. 8B shows an example of a tile 102 including a multithreaded processor 200B having n program counters (PC(1)-PC(n)) and n register files (Reg(1)-Reg(n)) that can be selectively coupled to an ALU 804 so that when one thread is waiting on a long latency event, the processor 200B switch to a new thread in a new context, characterized by a different program counter and register file.

Figure 8C:
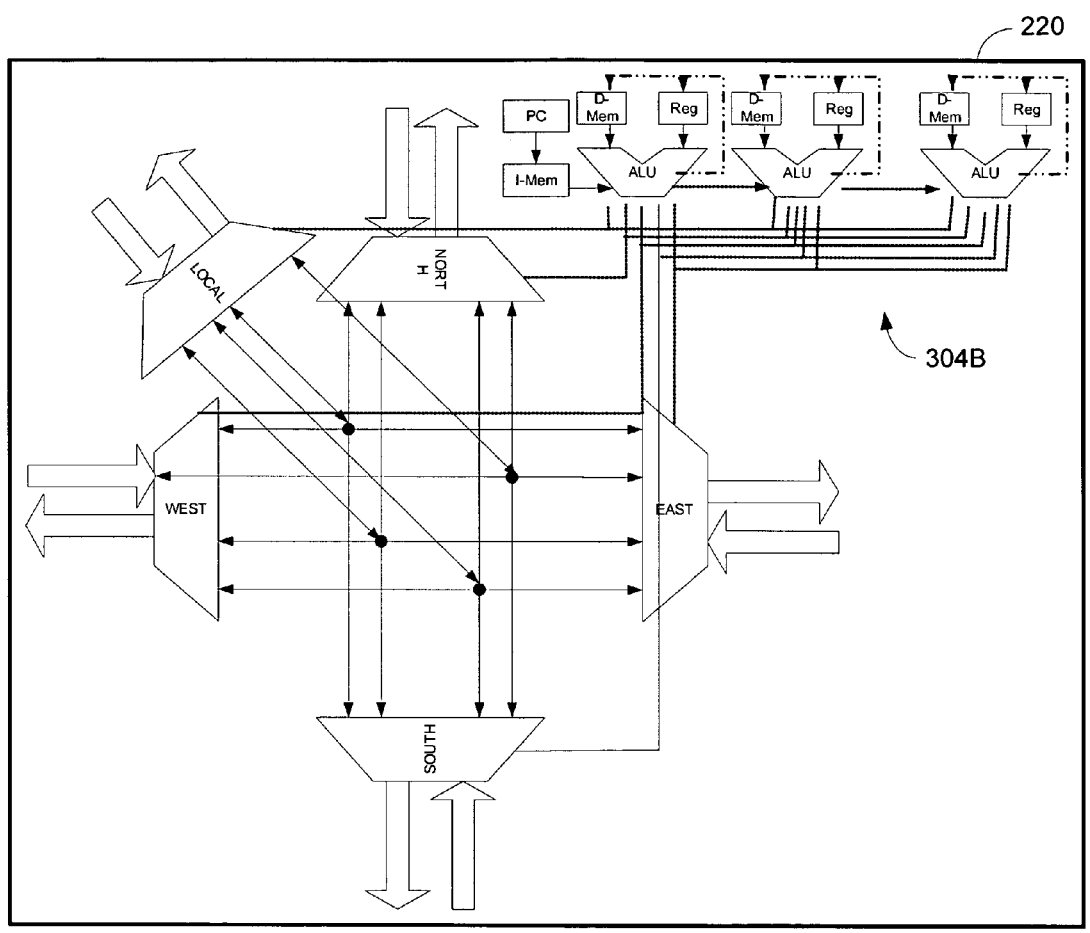
FIG. 8C is a block diagram of a VLIW switch processor.
Figure 8D:
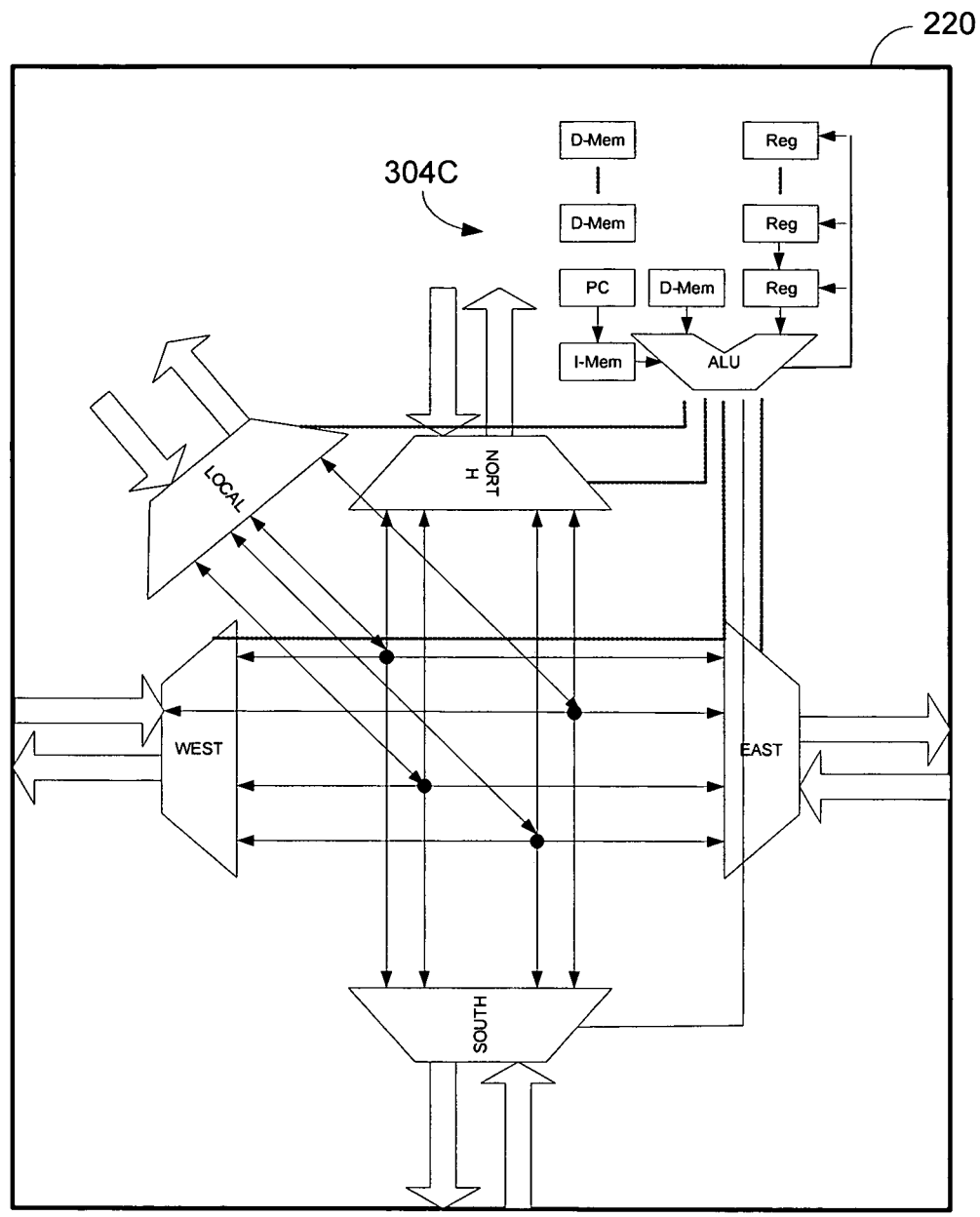
FIG. 8D is a block diagram of a multithreaded switch processor.

A switch processor can also be a VLIW processor 304B or a multithreaded processor 304C, as shown in FIGS. 8C and 8D, respectively.

When a compiler partitions a program into subprograms to execute in a tiled integrated circuit having VLIW or multi-threaded processors in the tiles, the compiler generate parallel code for a maximum number of threads larger than the number of tiles in the integrated circuit 100 (e.g., up to four times the number of tiles if each tile has a VLIW processor with four subinstructions).

In the partitioning phase, the compiler partitions a program into sets of instructions that are able to be executed in parallel. For example, the compiler uses a graph to indicate which instructions can be executed in parallel. In the placement phase, the compiler maps the sets of instructions to tiles. The compiler determines in which tile each of the sets of instructions is to be executed is based in part on critical path information from the graph to determine which instructions to run in the same tile, and which to run in separate tiles. One or more of these sets of instructions selected to run within the same tile represent a subprogram for the tile.

Thus, a subprogram for a tile may include multiple sets of instructions that can be executed in parallel threads within the tile. For example, in a VLIW processor, for those sets of instructions selected to execute on the same tile, the compiler determines instructions within the sets of instructions that will run in parallel in the same VLIW macroinstruction. The compiler determines instructions for a macroinstruction based in part on information characterizing which functional units (e.g., ALUs) are available to be used in parallel to execute a macroinstruction.

3.12 Configurable Memory

A tile can include a configurable memory. Various attributes of the memory in a tile, such as processor instruction memory or a data memory or a switch instruction memory, can be configured to save power or otherwise provide more efficient memory usage.

3.12.1 Small Instruction Memory

For many applications, a small amount of switch instruction memory is often sufficient to provide efficient operation. In fact, for some applications just one instruction worth of instruction memory may suffice. For example, the same switch instruction can be used repeatedly for multiple cycles.

To save power in circuitry implementing the static network, the static switches can include a configurable switch instruction memory whose size can be reduced such that only a desired portion of the entire memory circuit consumes power, forming a "small instruction memory." The small instruction memory can optionally operate as a cache. When one segment of the configurable switch instruction memory is in use as part of the small instruction memory, the other unused segments can be turned off using mode indicators. For example, in a memory with four equal size segments, a program smaller than the size of one segment, only powers one segment to use as the small instruction memory or cache to save power.

Similarly, the processor 200 can use a small instruction memory, or a small data memory, in which segments are turned on or off depending on the amount of memory needed. Mode indicators can be used to turn segments on or off.

A memory can also be configured to have one segment operate as a cache and another segment operate as a non-cached memory (e.g., SRAM).

A small instruction memory can also be used to improve real-time performance by placing critical instructions in a separate configurable memory so that they do not conflict with non-critical instructions. For example, critical and non-critical instructions that are not stored in separate memories can land on top of each other in the same cache lines and interfere with each other (e.g., a non-critical instruction can evict a critical instruction). When a critical instruction is delayed due to a cache miss, the delay can lead to unpredictable behavior. By placing time critical instructions in a separate memory, more predictable behavior can be achieved. The processor 200 includes circuitry to fetch instructions from both critical and non-critical memories. For example, there can be two types of instruction fetches, one for critical instructions and another for non-critical instructions. Software instruction caching or compiler managed instruction caching can also be used to manage the small instruction memory.

3.12.2 Split Instruction Memories

The demands of computing and logic-level or bit-level processing (e.g., using the RL) tend to be quite different. Computing tends to be dominated by deep and complex if-then-else clauses, recursions and the like, which can be called control complex (e.g., using many clock cycles or many iterations). Logic-level or bit-level processing tends to use many different operators for many different functions, but do not require chained levels of reasoning (e.g., using few clock cycles or few iterations). The application areas characterized by computing may use devices plugged into a power source, while the application areas characterized by logic-level processing may use battery powered devices, and so have stringent low-power requirements. The power requirements, may of course, be completely reversed sometimes.

Instruction memory in a tile can be split between two types of instruction memory modules that are tailored for use by the processor 200 for computing type processing, or by the RL 500 for logic-level type processing. For purposes of clarity the two types of instruction memory associated with computing instructions and logic-level instructions are named differently. The former type of instruction memory is called "compute instruction memory", while the latter is called "logic-level instruction memory". The compute instruction memory and the logic-level instruction memory can be physically separate memory modules, or different sections of a single memory module that serve as either compute instruction memory or logic-level instruction memory.

The compute instruction memory can be a narrow, deep (e.g., hundreds or thousands) instruction memory, that can also serve as an instruction cache. The compute instruction memory can provide instruction words ranging from 32 bits to 64 or 128 bits or 10 or 20 times more. The compute instruction memory can range in size from a total of about 1 Kbyte to about 1 Mbyte to 16 Mbytes (or increase as technology scales).

The compute instruction memory can be operated as a cache. The compute instruction memory can also use a mode indicator called the Per-Tile-I-Cache-Mode-Bit that makes the memory behave either as a memory or as a cache. The cache can be internally banked. The banks can all be accessed simultaneously or only energized based on the low order bits depending on the energy requirements of the applications. There is another mode indicator called the Cache-Energy-Mode-Bit that dictates the energy level to be used. The compiler or firmware can set this mode indicator.

The logic-level instruction memory can be a wide, shallow (e.g., few or tens) instruction memory. In fact, an important special case is one in which the depth level is one, so that there is only one instruction. That is, the RL is able to execute only one instruction, for example, to conserve energy.

A second case is one in which there are a few entries (e.g., 16 or 32 or 1K entries, but still much fewer than the number of entries in the compute instruction memory). There is also a program counter for the logic-level memory called the logic-level-PC so that a tile can loop around in this memory. The contents of this logic-level instruction memory are used to determine the function of the RL.

The logic-level memory, whether single entry, or multiple entry, can also be organized as an instruction cache. The usual instruction cache design choices apply.

This architecture is also called a split-PC architecture: one program counter for the compute instructions and one program counter for the logic-level instructions. When the logic-level memory for the RL is one-deep, the program counter for the RL is not used. In this case, the architecture becomes a single-PC architecture. Thus, the RL can be viewed as creating a special instruction. The program counter for the RL can in this case be shut down to reduce the power consumption.

3.12.3 Common Compute and Logic-Level L2 or L3 Cache of External Memory

The cache misses of the logic-level instruction cache, or the compute instruction cache can be satisfied by a next level cache or memory that is external to the integrated circuit 100. Alternately, the next level cache (e.g., an L2 cache) can be on-chip. The L2 cache can be common to both the logic-level and the compute instruction cache. The compute instructions and the logic-level instructions can also conveniently occupy the same global address space. The integrated circuit 100 can also have a single L3 cache.

3.12.4 Memory Versus Cache Mode Indicators

Caches are a mixed blessing. On the one hand they allow a program to access instructions or data without worrying about whether data will fit or not. But on the other hand, they are power hungry. A tile can include a mode indicator for the instruction cache, data cache, and the switch instruction cache that allow each of them to be operated as a non-cached memory. These mode indicators allow the same integrated circuit 100 to be sold to some customers with these structures working as a cache and to some customers with these structures working as a memory.

3.12.5 Level 2 DRAM Cache or Memory on Chip

The Integrated circuit 100 includes an optional L2 cache or DRAM on-chip. There can be two types of integrated circuits 100 than can be fabricated. One with the L2 cache and one without. A mode indicator can select whether the tiles include the cache.

3.13 Compiling Logic-level instructions

The compiler (or a user) processes a high-level program written in a language such as C and an optional logic-level program written in a language such as Verilog. The compiler then creates an automatic partitioning of the C program into p partitions and the verilog program into p partitions, where p is the number of tiles. Each of the p partitions contains up to four further subpartitions: (1) a program for the compute instruction processing within a tile, (2) a logic-level bitstream for the logic-level processing within a tile, (3) a switch program for the switch instructions, and (4) and a switch logic-level bitstream for an optional switch logic-level component. The optional logic-level program at the input of the compiler can be multiple input Verilog programs combined together, or a single Verilog program replicated p times, or some number of times. Verilog may be substituted by VHDL or system verilog, or system C or Bluespec, or C-level or Matlab or RTL or a suitable hardware design language or equivalent or an as yet not invented language.

The compiler then automatically determines the edges of a program communication dependency graph that cross partitions. Edges cross partitions if communication is required between partitions. For each edge, the compiler determines a suitable route pattern through the network going through one of more switches to a destination. The source and destination can, for example, be a memory on a tile, a register, a logic element, an ALU, a switch, or an I/O element. At the same time the compiler also determines the routing schedule, i.e., the time sequence in which the routing and operations occur in the RL 500 and processor 200. Thus, the logic and switching in the integrated circuit 100 can be scheduled and routed by the compiler, including both the RL operations and the processor instructions.

Alternatively, the input can start out being a single high-level program written in a language such as C or Java or C++ or matlab or fortran or systemC or Perl or other such language. The compiler then creates two programs, one C program and one Verilog or VHDL or other hardware description language program. These programs can then be compiled as described above.

Alternatively, the input can start out being a single logic-level program written in a hardware description language such as Verilog or VHDL. The compiler then creates two programs, one C program and one Verilog or VHDL program or other hardware description language program. These programs can then be compiled as described above The compiling approaches described above can be augmented at any point with a piece of hardware description either by hand or by the compiler which describes an I/O wrapper to be added to include devices such as SerDes, memory controllers such as DDR and QDRs, PCI Express interfaces, mode bits, resets, clocks, power supplies, test, JTAG, and other typical I/O interfaces.

The compiler also automatically adds edges between program portions represented by the RL instructions and the processor instructions. The compiler may also combine multiple edges between RL instructions and processor instructions into a single edge. The compiler may also combine multiple logic-level to logic-level edges on different tiles with a single communication event on the network.

3.14 Asynchronous Clocking of Tiles or Collections of Tiles

The integrated circuit 100 allows the option of having either a single synchronous clock domain, or multiple, potentially asynchronous, clock domains. For example, each of multiple clock domains controls an individual set of one or more neighboring tiles. In some implementations, each domain is clocked at an integral multiple (e.g., 2, 4, 8) of a base clock frequency.

The communications channels between asynchronous clock domains talk to each other through synchronizers. Synchronizers are, for example, FIFO buffers that are clocked by clocks from the two domains.

3.15 Applications 3.15.1 Packet Processing and Intrusion Detection and Prevention The integrated circuit 100 is capable of processing networking packet data received over one or more I/O connections. The packets are processed in the tiles in a combination of parallel processing and pipelined processing. The packet data can be TCP/IP data, or UDP data, or RDP data, or RDMA data or Sockets or other form of streaming data, for example, IPSEC data. The packet data can be processed for intrusion prevention and intrusion detection.

There are many ways in which the tiled integrated circuit 100 can be used to implement an intrusion detection system (IDS) and/or an intrusion prevention system (IPS). For example, data patterns corresponding to a virus or other patters are stored in external (i.e., off-chip) or internal (i.e., on-chip) DRAM. Network packets are streamed into the integrated circuit 100 from the network over a SerDes or other interface such as PCI Express or GE (Gigabit Ethernet). The embedded data is recovered from the packet using one or more "extraction tiles" and the data is then passed on to other "matching tiles." These matching tiles then perform a pattern matching operation on the data against the virus patterns. The patterns are fetched in from DRAM into the local caches of the matching tiles. The packet data are multicast to all of the matching tiles, where the packet data are compared to all the stored patterns simultaneously, thereby obtaining vast speed-ups over serial methods of IDS or IPS. If the comparison indicates a match, then a virus is detected. This method of IDS or IPS using a Integrated circuit 100 can be termed a caching method.

An alternative method, called a streaming method, works as follows. One or more packets (e.g., several dozen packets) are read into the integrated circuit 100 and stored in various tiles. Then virus patterns from DRAMs are streamed through the integrated circuit 100 and compared against the stored packet data. Here, the tiles do not suffer cache misses to fetch the pattern data, and are able to exploit the fact that the static networks of the integrated circuit 100 can be configured as stream-optimized data paths for fast matching and streaming.

3.15.2 Multimedia Packet Processing

Another form of packet data the integrated circuit 100 is able to process is multimedia data such as video data. The packets may contain video data that is generated, for example, from cell phones, or cameras.

The data may need to be converted from one coding format (corresponding, for example, to one cell phone manufacturer) to another (for example, corresponding to another manufacturer) in a process called transcoding. In transcoding, the integrated circuit 100 accepts incoming network packets and performs a decoding function followed by an encoding function. For example, the decoding and encoding functions may involve different variants of MPEG4 format standards.

The processing can also involve processing the video from cameras, for example, from surveillance cameras. For example, the processing can include compressing the video, and storing the compressed video on a disk. These computational activities can be distributed throughout the tiles on the integrated circuit 100. The computational activities can also include processing the video for collecting various forms of metadata and for intelligence processing. The processing can include motion detection and estimation, human detection, activity detection, suspicious activity detection, tracting, monitoring, and so on.

In an example of processing video in a tiled integrated circuit 100, one or more input tiles receives a video stream from off-chip (e.g., stored in global shared memory accessible to the tiles), distributes the video to multiple processing tiles, and assembles a processed video stream to send off-chip from one or more output tiles.

The input tile(s) distribute the video data by dividing each video frame into sections and assigning each section to a processing tile. The processing tiles perform an operation such as compressing or uncompressing the section of the video frame (e.g., using an encoding/decoding format such as MPEG2, H.264, MPEG4, JPEG, Windows media formats). In some encoding/decoding techniques different portions of a frame are processed based on other portions of the frame. In this case, the processing tiles exchange information to enable such processing to occur. The assignment of segments to processing tiles can be selected to reduce the amount of communication needed (e.g., by assigning adjacent segments to adjacent tiles).

The output tile(s) assemble a processed video frame from the processed video frame segments. One of the output tiles sends an output processed video stream over an I/O interface to an off-chip memory or device.

3.16 Yield Improvement Using Tile Skipping Logic

Yields can be a problem in the integrated circuit industry. Integrated circuits are fabricated on a wafer of semiconductor material which is cut into multiple dice, each containing an integrated circuit. A single defect can make an entire integrated circuit faulty and thus wasted. A tiled integrated circuit 100 includes circuitry called Tile Skipping Logic (TSL) to address this problem, increasing the yield of non-faulty integrated circuits from a wafer.

Figure 9A:
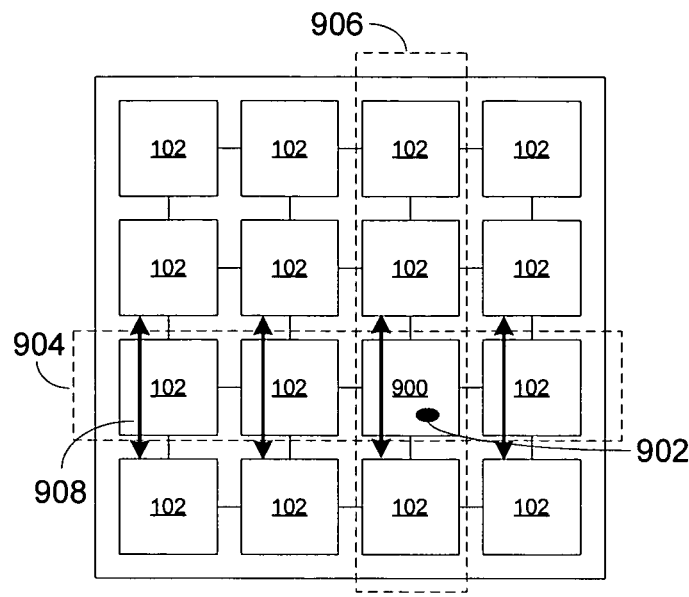
FIG. 9A is a block diagram of a tile array.

Referring to FIG. 9A, a tile 900 of an integrated circuit 100 has a fault 902 in it. This may happen, for example, if one of the ALUs in the tile is faulty. This fault can be detected, for example, in a manufacturing test. In conventional practice the die on the wafer containing this faulty circuit might be marked as faulty and would be thrown away. However, the integrated circuit on the faulty die can be salvaged as follows. Because of the regular tiled structure, the manufacturer is able to discard (e.g., power down) one entire row and column of tiles containing the faulty tile 900 and still get a functioning mesh network of tiles in the integrated circuit. The row and column containing the faulty tile 900 are denoted as the faulty row 904 and the faulty column 906, respectively.

Each switch includes a mechanism that can be set at manufacturing time in a way that forms a data path 908 through the switch that is able to transport data through the tile even if circuitry in the tile is powered down, or otherwise not fully functioning as a node of the network. There are many ways of forming such a data path 908.

Figure 9B:
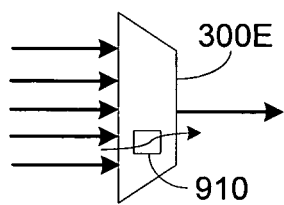
FIGS. 9B and 9C are block diagrams of circuitry for forming a data path.

Referring to FIG. 9B, one way to form the data path is to have a fuse 910 on each wire going through a switch such that the final multiplexing stage 300E on the switch always passes that wire through the tile when that fuse 910 is blown at manufacturing time. For example, a laser can be used to selectively blow fuses in the appropriate tiles. If the fuses for the switch multiplexers along a row are blown, all the network traffic from the upper row coming in the north port are automatically passed out of the south port to the lower row (and similarly for south to north traffic). Thus, a 4×3 array of tiles is formed from a 4×4 array of tiles. The TSL technique can be transitively applied to additional rows and columns as further tiles are discovered to be faulty. This results in smaller tile arrays that are still functional. The mesh network topology of the integrated circuit 100 is not lost even after losing a column and row of the tile array 101, and the software run on the integrated circuit, including the network protocols, continues to work.

Figure 9C:
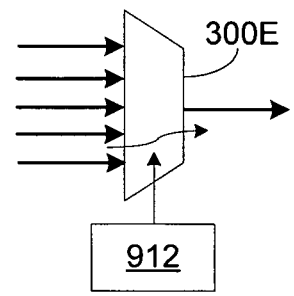

Referring to FIG. 9C, another way to form the data path is to have a ROM 912 on the integrated circuit 100 and set appropriate bits on the ROM 912 at manufacturing time such that the ROM 912 controls control bits on the multiplexers in the switches in the tiles of the faulty rows and columns to form a data path through the tile.

There are also other techniques used for memory arrays, which can also be used to jumper connections for tiles in the integrated circuit 100.

When a data path is formed through a switch, the length of a wire in the path is increased (e.g., by twice or more). However, an integrated circuit 100 that has been salvaged in this way can be clocked slightly slower to compensate for the longer propagation delay, and sold at lower prices if needed. The wires can also be driven by relatively strong buffers knowing that the data paths may become longer because of the TSL technique.

3.17 Functional Blocks

The tiled architecture integrated circuit 100 allows the implementation of "functional blocks." These functional blocks can implement functions like TCP/IP engines, framers, codecs, fast Fourier transforms (FFTs), and other functions. The functional blocks can be implemented using high-level C programs or other programs in other languages running on one or more tiles. The tiles can be contiguous in space or non-contiguous in space.

One type of functional blocks are call "soft functional blocks." The mapping of soft functional blocks to tiles is reconfigurable. The soft functional blocks can be mapped onto certain tiles by one customer. The same tiles can be used by another customer for another set of soft functional blocks. The soft functional blocks provided by one party (e.g., a company) in a high-level language can be modified by a second party (e.g., a customer) if they choose to. Alternatively, encrypted soft functional blocks provided by a first party cannot be modified by a second party.

Soft functional blocks can be placed on an arrangement of tiles translated in space. For example, if a soft functional block needs 4 contiguous tiles arranged in a square configuration, then that arrangement of 4 tiles could be placed in the top left hand corner of the array of tiles 101 if space is available there. Alternatively, the same arrangement of 4 tiles could be placed in the bottom right hand corner of the array of tiles 101, for example.

Data can routed through the data networks on the integrated circuit 100 to wherever the soft functional block is implemented.

Another type of functional blocks are called "hard functional blocks." Hard functional blocks are implemented within tiles of an integrated circuit 100 by a first party. A second party that has an existing system (e.g., a customer that has a large integrated circuit) is then able to couple the integrated circuit 100 to the existing system to incorporate the hard functional block into the existing system.

Various features of the tiled integrated circuit architecture and programming described herein can be implemented by modifying versions of the tiled integrated circuits described in the following publications: "Baring It All to Software: RAW Machines" *IEEE Computer*, September 1997, pp. 86-93, "Space-Time Scheduling of Instruction-Level Parallelism on a Raw Machine," *Proceedings of the Eighth International Conference on Architectural Support for Programming Languages and Operating Systems (ASPLOS-VIII)*, San Jose, Calif., Oct. 4-7, 1998, "Raw Computation" *Scientific American*, August 1999, Vol. 281, No. 2, pp. 44-47, "The Raw Microprocessor: A Computational Fabric for Software Circuits and General Purpose Programs," *IEEE Micro*, March/April 2002, pp. 25-35, and "A 16-issue multiple-program-counter microprocessor with point-to-point scalar operand network," *Proceedings of the IEEE International Solid-State Circuits Conference*, February 2003, each of which is incorporated herein by reference.

It is to be understood that the foregoing description is intended to illustrate and not to limit the scope of the invention, which is defined by the scope of the appended claims. Other embodiments are within the scope of the following claims.

What is claimed is:

1. An integrated circuit comprising:
a plurality of tiles, each tile comprising
a processor;
a switch including switching circuitry to forward data over data paths from other tiles to the processor and to switches of other tiles; and
a direct memory access (DMA) queue that stores data to be sent to a memory;
wherein each tile is configured to process data received over the switch based on information that determines whether the data is to be handled by the processor or to be stored in the DMA queue for direct memory transfer without involving the processor comprising a mode indicator associated with a port of the switch over which the data is received.

2. The integrated circuit of claim 1, wherein the information that determines whether the data received over the switch is to be handled by the processor or to be stored in the DMA queue for direct memory transfer without involving the processor comprises information appended to or prepended to or inserted into the data.

3. The integrated circuit of claim 1, wherein the memory is in the tile.

4. The integrated circuit of claim 1, wherein the memory is in a different tile.

5. The integrated circuit of claim 1, wherein the memory is external to the plurality of tiles.

6. The integrated circuit of claim 1, wherein the memory is configured to operate as a cache.

7. The integrated circuit of claim 1, wherein the data to be sent to the memory is stored in a cache in the tile.

8. The integrated circuit of claim 1, wherein the data to be sent to the memory is stored in a cache in a different tile.

9. The integrated circuit of claim 1, wherein the switch is able to store data received from other tiles in the direct memory access queue without requiring the processor to execute an instruction to receive the data.

10. The integrated circuit of claim 9, wherein the data is received from another tile over a static network according to a switch instruction executed at the switch.

11. The integrated circuit of claim 9, wherein the data is received from another tile over a dynamic network according to routing information in the data.

12. The integrated circuit of claim 1, further comprising:
a content addressable memory coupled to the processor;
with the processor configured to:
provide a first value to the content addressable memory;
receive a second value from the content addressable memory associated with the first value; and commit the second value to be forwarded from the switch.

13. The integrated circuit of claim 1, wherein the data received over the switch comprises data received from a different tile.

14. The integrated circuit of claim 1, wherein the data received over the switch comprises data received from a memory external to the plurality of tiles.

15. The integrated circuit of claim 1, wherein each tile is configured to send data stored in the DMA queue to the memory without requiring the processor to execute an instruction for each of multiple segments of the data sized greater than a cache line.

16. An integrated circuit comprising:
a plurality of tiles, each tile comprising
a processor that is pipelined and configured to process multiple streams of instructions for the processor;
a switch including switching circuitry to forward data over data paths from other tiles to one or more pipeline stages of the processor and to switches of other tiles, wherein at least some of the data is forwarded based on one or more streams of instructions for the switch; and
multiple multiplexers each configured to couple data to a different port of the switch and to select data from one of multiple pipeline stages and from one of the multiple streams.

17. The integrated circuit of claim 16, wherein the processor comprises a Very Long Instruction Word (VLIW) processor and the multiple streams of instructions comprise subinstructions of a stream of VLIW instructions.

18. The integrated circuit of claim 17, wherein a subinstruction in a VLIW instruction is able to read from or write to a port of the switch.

19. The integrated circuit of claim 18, wherein the processor is configured to stall execution of a VLIW instruction if a subinstruction of the VLIW instruction is temporarily unable to read from or write to a port of the switch.

20. The integrated circuit of claim 16, wherein the processor includes multiple logic units that operate based on a common program counter.

21. The integrated circuit of claim 20, wherein each of the multiple streams are processed by a corresponding one of the logic units.

22. The integrated circuit of claim 20, wherein the logic units comprise one or more of an arithmetic logic unit, an arithmetic unit, a multiply accumulate unit, a multiply add unit, a vector unit, a load or store unit, a branch unit, a switch read unit, or a switch write unit.

23. The integrated circuit of claim 22, wherein the logic unit comprises a switch write unit that includes a buffer.

24. The integrated circuit of claim 16, wherein the multiplexers are coupled to bypass paths that connect non-adjacent pipeline stages of the processor.

25. The integrated circuit of claim 16, wherein the switch includes at least one instruction memory, at least one program counter, and at least one logic unit.

26. The integrated circuit of claim 16, wherein the pipelined processor comprises a multithreaded processor, and the multiple streams comprise threads.

27. The integrated circuit of claim 16, wherein the processor includes multiple program counters that respectively control execution of the multiple streams.

28. The integrated circuit of claim 27, wherein the processor includes multiple register files each associated with a corresponding one of the multiple streams.

29. The integrated circuit of claim 16, further comprising circuitry to serialize write operations of instructions from different streams scheduled for execution in the same cycle in response to the write operations writing data to be forwarded from a same port of the switch, allowing the data to be forwarded from the same port sequentially.

30. A method of compiling a program for an integrated circuit, the integrated circuit comprising tiles, each tile comprising a processor and a switch including switching circuitry to forward data over data paths to the processor and to switches of other tiles, the method comprising:
partitioning the program into subprograms to be processed in different tiles; and
subpartitioning the subprograms into a plurality of compute instruction streams for execution in a respective plurality of logic units in the processor of a tile based on a common program counter, wherein compute instructions from different streams are scheduled for execution in different cycles if both instructions write data to be forwarded from a same port of the associated switch of the tile.

31. The method of claim 30, wherein partitioning the program into subprograms to be processed in different tiles comprises partitioning the program into a processor subprogram and a switch subprogram for each of the different tiles.

32. The method of claim 31, wherein subpartitioning the subprogram for a tile into a plurality of compute instruction streams comprises subpartitioning the processor subprogram for the tile into the plurality of compute instruction streams.

33. A method of compiling a program for an integrated circuit, the integrated circuit comprising tiles, each tile comprising a processor and a switch including switching circuitry to forward data over data paths to the processor and to switches of other tiles, the method comprising:
partitioning the program into sets of instructions that can be executed in parallel;
determining in which tile each of the sets of instructions is to be executed; and
for those sets of instructions selected to be executed in a same tile, determining which instructions from the sets of instructions are to be executed in parallel in a same macroinstruction based at least in part on whether the instructions write data to be forwarded from a same port of the associated switch of the tile.

34. The method of claim 33, wherein determining which instructions from the sets of instructions are to be executed in parallel in the same macroinstruction is based on information characterizing which functional units are available to be used in parallel to execute a macroinstruction.

35. The method of claim 33, wherein determining in which tile each of the sets of instructions is to be executed is based on critical path information from a graph that indicates which instructions can be executed in parallel.

* * * * *

UNITED STATES PATENT AND TRADEMARK OFFICE
CERTIFICATE OF CORRECTION

| | | |
|---|---|---|
| PATENT NO. | : 8,656,141 B1 | Page 1 of 1 |
| APPLICATION NO. | : 11/302956 | |
| DATED | : February 18, 2014 | |
| INVENTOR(S) | : Anant Agarwal | |

It is certified that error appears in the above-identified patent and that said Letters Patent is hereby corrected as shown below:

Please add the priority information on the Title page of the Letters Patent as follows:

Item (62) This application claims the benefit of U.S. Provisional Application 60/636,166, filed 12-14-2004 (expired) and claims the benefit of U.S. Provisional Application 60/635,546, filed 12-13-2004 (expired).

Signed and Sealed this
Third Day of June, 2014

Michelle K. Lee
*Deputy Director of the United States Patent and Trademark Office*